(12) United States Patent
Chiu et al.

(10) Patent No.: US 10,083,888 B2
(45) Date of Patent: Sep. 25, 2018

(54) SEMICONDUCTOR DEVICE PACKAGE

(71) Applicant: Advanced Semiconductor Engineering, Inc., Kaohsiung (TW)

(72) Inventors: Chi-Tsung Chiu, Kaohsiung (TW); Meng-Jen Wang, Kaohsiung (TW); Cheng-Hsi Chuang, Kaohsiung (TW); Hui-Ying Hsieh, Kaohsiung (TW); Hui Hua Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/250,713

(22) Filed: Aug. 29, 2016

(65) Prior Publication Data

US 2017/0148746 A1    May 25, 2017

Related U.S. Application Data

(60) Provisional application No. 62/257,488, filed on Nov. 19, 2015.

(51) Int. Cl.
*H01L 23/31* (2006.01)
*H01L 23/00* (2006.01)
(Continued)

(52) U.S. Cl.
CPC .......... *H01L 23/3121* (2013.01); *H01L 21/78* (2013.01); *H01L 21/786* (2013.01); *H01L 23/13* (2013.01); *H01L 23/14* (2013.01); *H01L 23/142* (2013.01); *H01L 23/29* (2013.01); *H01L 23/3142* (2013.01); *H01L 23/492* (2013.01);
(Continued)

(58) Field of Classification Search
CPC ... H01L 21/561; H01L 21/78; H01L 2224/18; H01L 23/13; H01L 23/3107; H01L 23/492; H01L 23/49541; H01L 23/5389; H01L 23/562; H01L 21/786; H01L 23/3121; H01L 23/14; H01L 23/49548; H01L 23/49575; H01L 23/49861; H01L 23/49586; H01L 23/4958; H01L 2224/04105; H01L 2224/12105; H01L 2224/8385; H01L 2224/2518; H01L 2224/73267; H01L 2224/24247;
(Continued)

(56) References Cited

U.S. PATENT DOCUMENTS 3,903,590 A * 9/1975 Yokogawa ............ H01L 23/142
                                                  257/708
4,456,641 A * 6/1984 Ohtani .................... H01L 23/13
                                                  257/701
(Continued)

*Primary Examiner* — Sophia Nguyen
(74) *Attorney, Agent, or Firm* — Foley & Lardner LLP; Cliff Z. Liu

(57) ABSTRACT

A semiconductor device package includes a conductive base, and a cavity defined from a first surface of the conductive base, the cavity having a bottom surface and a depth. A semiconductor die is disposed on the bottom surface of the cavity, the semiconductor die having a first surface and a second surface opposite the first surface. The second surface of the semiconductor die is bonded to the bottom surface of the cavity. A distance between the first surface of the semiconductor die and the first surface of the conductive base is about 20% of the depth of the cavity.

17 Claims, 26 Drawing Sheets

(51) Int. Cl.
  *H01L 21/78* (2006.01)
  *H01L 23/29* (2006.01)
  *H01L 23/14* (2006.01)
  *H01L 21/786* (2006.01)
  *H01L 23/498* (2006.01)
  *H01L 23/13* (2006.01)
  *H01L 23/492* (2006.01)
  *H01L 23/538* (2006.01)
  *H01L 23/495* (2006.01)
  *H01L 25/07* (2006.01)
  *H01L 21/56* (2006.01)

(52) U.S. Cl.
  CPC .. *H01L 23/49548* (2013.01); *H01L 23/49575* (2013.01); *H01L 23/49582* (2013.01); *H01L 23/49586* (2013.01); *H01L 23/49861* (2013.01); *H01L 23/5389* (2013.01); *H01L 23/562* (2013.01); *H01L 24/19* (2013.01); *H01L 24/24* (2013.01); *H01L 24/25* (2013.01); *H01L 24/97* (2013.01); *H01L 21/561* (2013.01); *H01L 23/315* (2013.01); *H01L 23/3107* (2013.01); *H01L 23/49541* (2013.01); *H01L 25/074* (2013.01); *H01L 2224/04105* (2013.01); *H01L 2224/12105* (2013.01); *H01L 2224/24247* (2013.01); *H01L 2224/2518* (2013.01); *H01L 2224/32245* (2013.01); *H01L 2224/32257* (2013.01); *H01L 2224/73267* (2013.01); *H01L 2224/8385* (2013.01); *H01L 2224/92244* (2013.01); *H01L 2224/97* (2013.01); *H01L 2924/15153* (2013.01)

(58) Field of Classification Search
  CPC . H01L 2224/92244; H01L 2224/32257; H01L 2224/32245
  See application file for complete search history.

(56) References Cited

U.S. PATENT DOCUMENTS

| | | | | |
|---|---|---|---|---|
| 4,472,333 A * | 9/1984 | Ohtani | | H01L 23/13 257/E23.004 |
| 5,095,360 A * | 3/1992 | Kizaki | | H01L 23/04 257/690 |
| 5,397,921 A * | 3/1995 | Karnezos | | H01L 23/3128 257/698 |
| 5,440,199 A * | 8/1995 | Heindl | | H01J 5/52 313/318.07 |
| 5,637,882 A * | 6/1997 | Divigalpitiya | | G03G 5/02 250/370.09 |
| 6,323,065 B1 * | 11/2001 | Karnezos | | H01L 23/3128 257/E23.101 |
| 6,544,812 B1 * | 4/2003 | Camenforte | | H01L 23/36 257/E23.069 |
| 6,639,324 B1 * | 10/2003 | Chien | | H01L 23/3121 257/700 |
| 6,709,898 B1 * | 3/2004 | Ma | | H01L 23/3128 257/675 |
| 6,833,619 B1 * | 12/2004 | Jang | | H01L 21/568 257/678 |
| 6,919,508 B2 * | 7/2005 | Forcier | | B81C 1/0023 174/565 |
| 7,122,901 B2 * | 10/2006 | Sunohara | | H01L 23/5389 257/750 |
| 7,339,278 B2 * | 3/2008 | Iksan | | H01L 23/3128 257/686 |
| 8,487,426 B2 * | 7/2013 | Essig | | H01L 23/488 257/698 |
| 8,772,924 B2 * | 7/2014 | Nalla | | H01L 21/568 257/698 |
| 8,981,464 B2 * | 3/2015 | Feng | | H01L 24/03 257/329 |
| 9,070,662 B2 * | 6/2015 | Michael | | H01L 23/3114 |
| 2004/0089922 A1 * | 5/2004 | Gerber | | H01L 21/568 257/668 |
| 2004/0266136 A1 * | 12/2004 | Jung | | H01L 21/76235 438/437 |
| 2005/0258537 A1 * | 11/2005 | Huang | | H01L 23/5389 257/738 |
| 2006/0060891 A1 * | 3/2006 | Pavier | | H01L 23/3107 257/232 |
| 2006/0071306 A1 * | 4/2006 | Lee | | H01L 23/49503 257/666 |
| 2006/0145328 A1 * | 7/2006 | Hsu | | H01L 23/5389 257/690 |
| 2006/0151203 A1 * | 7/2006 | Krueger | | H03H 9/0557 174/260 |
| 2006/0214288 A1 * | 9/2006 | Ohsumi | | H01L 23/13 257/724 |
| 2008/0003750 A1 * | 1/2008 | Kim | | H01L 27/115 438/266 |
| 2008/0116564 A1 * | 5/2008 | Yang | | H01L 23/5389 257/698 |
| 2008/0197479 A1 * | 8/2008 | Kim | | G06K 19/07743 257/698 |
| 2009/0206470 A1 * | 8/2009 | Horiuchi | | H01L 23/5389 257/698 |
| 2010/0019368 A1 * | 1/2010 | Shin | | H01L 23/24 257/686 |
| 2010/0148357 A1 * | 6/2010 | Yang | | H01L 24/24 257/713 |
| 2010/0213599 A1 * | 8/2010 | Watanabe | | H01L 23/13 257/693 |
| 2010/0302112 A1 * | 12/2010 | Lindenmeier | | H01Q 9/28 343/713 |
| 2011/0068990 A1 * | 3/2011 | Grzyb | | H01P 1/042 343/772 |
| 2012/0020026 A1 * | 1/2012 | Oganesian | | H01L 23/5389 361/707 |
| 2012/0052642 A1 * | 3/2012 | Endo | | H01L 21/30604 438/270 |
| 2012/0119391 A1 * | 5/2012 | Koizumi | | H01L 21/561 257/782 |
| 2012/0129300 A1 * | 5/2012 | Lin | | H01L 21/56 438/122 |
| 2012/0235309 A1 * | 9/2012 | Essig | | H01L 23/488 257/782 |
| 2014/0110859 A1 * | 4/2014 | Rafferty | | H01L 23/4985 257/774 |
| 2014/0239383 A1 * | 8/2014 | Feng | | H01L 24/03 257/329 |
| 2015/0194585 A1 * | 7/2015 | Kim | | H01L 33/62 257/99 |
| 2016/0300782 A1 * | 10/2016 | Chen | | H01L 23/49548 |
| 2017/0147852 A1 * | 5/2017 | Benkley, III | | G06K 9/0002 |
| 2017/0148746 A1 * | 5/2017 | Chiu | | H01L 23/562 |

* cited by examiner

SEMICONDUCTOR DEVICE PACKAGE

CROSS-REFERENCE TO RELATED PATENT APPLICATIONS

This application claims the benefit of and priority to U.S. Provisional Patent Application 62/257,488 filed Nov. 19, 2015 to Chiu et al., titled "Semiconductor Device Package," the contents of which are incorporated herein by reference in their entirety.

BACKGROUND

1. Technical Field

The present disclosure relates to a semiconductor device package and a method of manufacturing the same. In particular, the present disclosure relates to a semiconductor device package structure including an improved conductive base and a method for manufacturing the same.

2. Description of the Related Art

A semiconductor device package structure includes a semiconductor die bonded to a leadframe. An insulating material (e.g., pre-impregnated composite fiber (p.p.)) can be used to cover and protect the semiconductor die and leadframe. However, the semiconductor die may be cracked during a process of laminating the insulating material to the semiconductor die and the leadframe. Thus, an improved technique for forming the semiconductor device package would be beneficial.

SUMMARY

In one or more embodiments, a semiconductor device package includes a conductive base, and a cavity defined from a first surface of the conductive base, the cavity having a bottom surface and a depth. A semiconductor die is disposed on the bottom surface of the cavity, the semiconductor die having a first surface and a second surface opposite the first surface. The second surface of the semiconductor die is bonded to the bottom surface of the cavity. A distance between the first surface of the semiconductor die and the first surface of the conductive base is about 20% of the depth of the cavity.

In one or more embodiments, a semiconductor device package includes a conductive base having a first surface and a second surface opposite the first surface. A cavity is defined from the first surface of the conductive base, and the cavity has a bottom surface and a depth. A semiconductor die disposed on the bottom surface of the cavity and has a first thickness. A conductive adhesive layer is disposed between the semiconductor die and the bottom surface of the cavity, and the conductive adhesive layer has a second thickness. A sum of the first thickness and the second thickness is different from the depth of the cavity.

In one or more embodiments, a semiconductor device package includes a conductive base having a first surface and a second surface opposite the first surface. A cavity is defined from the first surface of the conductive base and has a bottom surface. The conductive base defines a sidewall of the cavity. A semiconductor die is disposed on the bottom surface of the cavity, the semiconductor die having a first surface and a second surface opposite the first surface. The second surface of the semiconductor die is bonded to the bottom surface of the cavity. A protection layer is disposed on the conductive base and the semiconductor die, the protection layer having a first surface. A first distance from the first surface of the semiconductor die to the first surface of the protection layer is different from a second distance from the first surface of the conductive base to the first surface of the protection layer.

BRIEF DESCRIPTION OF THE DRAWINGS

Common reference numerals are used throughout the drawings and the detailed description to indicate the same or similar elements. Embodiments of the present disclosure will be more apparent from the following detailed description taken in conjunction with the accompanying drawings.

DETAILED DESCRIPTION

Described in this disclosure are techniques for providing devices with reduced package sizes. In particular, the present disclosure relates to a semiconductor device package structure including an improved conductive base for avoiding the cracking of the semiconductor die during a process of laminating the insulating material.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration, and that practical implementations of the structures described herein can be spatially arranged in any orientation or manner, provided that the merits of embodiments of this disclosure are not deviated by such arrangement.

Figure 1A:
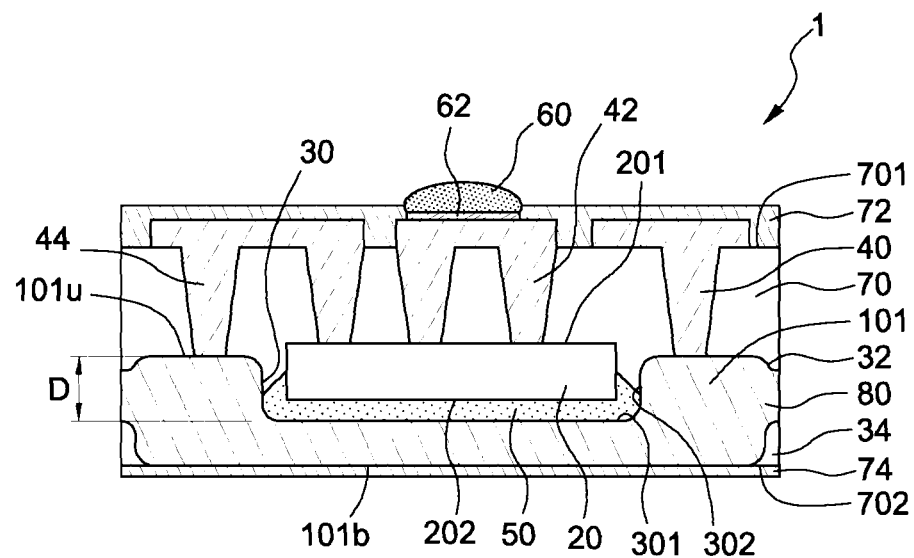
FIG. 1A is a cross-sectional view of a semiconductor device package in accordance with an embodiment of the present disclosure.

FIG. 1A is a cross-sectional view of a semiconductor device package 1 in accordance with an embodiment of the present disclosure. The semiconductor device package 1 includes a conductive base 101, a semiconductor die 20, a conductive adhesive layer 50, a protection layer 70 that is additionally a support layer, insulating layers 72 and 74, interconnection structures 40, 42 and 44, conductive pad 62 and conductive connects 60.

The conductive base 101 includes an upper surface 101u and a surface 101b opposite to the upper surface 101u. The material of the conductive base 101 may be, for example, copper or other metal, or a metal alloy, or other conductive material. In some embodiments, the conductive base 101 may be a die paddle. In some embodiments, the conductive base 101 includes one or more smoothed corners 32 of the conductive base 101 to reduce or minimize stress at the respective corners 32 during a manufacturing operation relative to the formation of the protection layer 70. The smoothing of the corners 32 may further be designed in a manner to redistribute stress across the conductive base 101, such as to more evenly apportion stress across the conductive base 101, or to transfer a stress point from one portion of the conductive base 101 to another portion of the conductive base 101. Accordingly, different corners 32 may have different radii of curvature and/or may form different angles of taper with respect to the upper surface 101u of the conductive base 101. The conductive base 101 includes one or more protrusions 80.

A cavity 30 is recessed from the upper surface 101u of the conductive base 101. The cavity 30 has a bottom surface 301, sidewalls 302 and a depth D. The cavity 30 is defined by the sidewalls 302 and the bottom surface 301. In some embodiments, the cavity 30 is defined by three or four sidewalls 302. In some embodiments, the depth D may be about 80 micrometers (μm) to about 120 μm. A semiconductor die 20 is disposed on the bottom surface 301 of the cavity 30. The cavity 30 is formed in the conductive base 101 to receive the semiconductor die 20 to decrease the package thickness. A compact three-dimensional (3-D) embedded package can be achieved by a design with the cavity 30.

In some embodiments, the semiconductor die 20 has an upper surface 201 and a surface 202 opposite the upper surface 201. The surface 202 of the semiconductor die 20 is bonded to the bottom surface 301 of the cavity 30 through the conductive adhesive layer 50. The conductive adhesive layer 50 may be, for example, a conductive gel or epoxy film (epoxy mixed with a conductive material), or other conductive material.

The conductive adhesive layer 50 is disposed between the surface 202 of the semiconductor die 20 and the bottom surface 301 of the cavity 30. In some embodiments, the conductive adhesive layer 50 completely covers the bottom surface 301 of the cavity 30, and extends to and contacts at least one sidewall 302 of the cavity 30. The conductive adhesive layer 50 may contact a portion of one or more sidewalls of the semiconductor die 20. The conductive adhesive layer 50 attaches the semiconductor die 20 to the conductive base 101. In the embodiment illustrated in FIG. 1A, an amount of the conductive adhesive layer 50 is designed to be sufficient for the conductive adhesive layer 50 to bleed (e.g., during a lamination operation) across the bottom surface 301 of the cavity 30 to contact the sidewalls of the semiconductor die 20 and the sidewalls 302 that define the cavity 30, to shorten a conductive current path.

In the embodiment illustrated in FIG. 1A, the upper surface 201 of the semiconductor die 20 is higher than the upper surface 101u of the conductive base 101. In some embodiments, a distance between the upper surface 201 of the semiconductor die 20 and the upper surface 101u of the conductive base 101 may be about 20% of the depth D of the cavity 30, or may be at least about 5% or at least about 10% of the depth D of the cavity 30, and up to about 35% or up to about 25% of the depth D of the cavity 30. In some embodiments, a sum of a thickness of the semiconductor die 20 and a thickness of the conductive adhesive layer 50 may be different than the depth D of the cavity 30. In some embodiments, such as the embodiment illustrated in FIG. 1A, the sum of the thickness of the semiconductor die 20 and the thickness of the conductive adhesive layer 50 is greater than the depth D of the cavity 30.

The protection layer 70 is disposed on the conductive base 101 and on the semiconductor die 20. The protection layer 70 includes an upper surface 701 and a surface 702 opposite to the upper surface 701. In some embodiments, the material of the protection layer 70 is a polypropylene resin; however, other suitable materials may be additionally or alternatively used. As noted above, the upper surface 201 of the semiconductor die 20 can be higher than the upper surface 101u of the conductive base 101 (e.g., as illustrated in the embodiment of FIG. 1A), which can serve to reduce or prevent formation of voids during lamination of the protection layer 70, in embodiments in which the protection layer 70 is laminated.

The interconnection structure 42 is electrically connected to pads on the upper surface 201 of the semiconductor die 20. The interconnection structure 40 is electrically connected to the upper surface 101u of the conductive base 101. The interconnection structure 44 is electrically connected to the upper surface 101u of the conductive base 101 and to a pad on the upper surface 201 of the semiconductor die 20. In some embodiments, the interconnection structures 40, 42 and 44 are vias formed through the protection layer 70. A material of interconnection structures 40, 42 and 44 may be, for example, copper or other metal, or a metal alloy, or other conductive material.

In some embodiments, a first distance from the upper surface 201 of the semiconductor die 20 to the upper surface 701 of the protection layer 70 is different from a second distance from the upper surface 101u of the conductive base 101 to the upper surface 701 of the protection layer 70. The first distance may be smaller than or greater than the second distance.

The insulating layer 72 is disposed on the upper surface 701 of the protection layer 70 and over the interconnection structures 40, 42 and 44. An insulating layer 74 is disposed on the surface 702 of the protection layer 70 and the surface 101b of the conductive base 101. In some embodiments, a material of one or both of the insulating layers 72 and 74 is a solder mask; however, polypropylene resin or other insulating materials may be used additionally or alternatively. The conductive base 101 defines a stepped structure which is filled with an insulating material 34. The insulating material 34 may be, for example, a polypropylene resin or other suitable material. The insulating layer 74 covers the insulating material 34 in the stepped structure. The stepped structure can minimize or prevent damage to the insulating layer 74 during separation (singulation) of individual semiconductor device packages 1 from a larger package (e.g., panel). In some embodiments, opening(s) may be formed in one or more of the sidewalls 302 of the cavity 30 to control a flow of the insulating material 34 during lamination of the protection layer 70.

The conductive pad 62 is formed on and electrically connected to the interconnection structure 42. A material of the conductive pad 62 may be, for example, copper or other metal, or a metal alloy, or other conductive material. The conductive connect 60 (e.g., a solder ball) is disposed on the conductive pad 62.

Figure 1B:
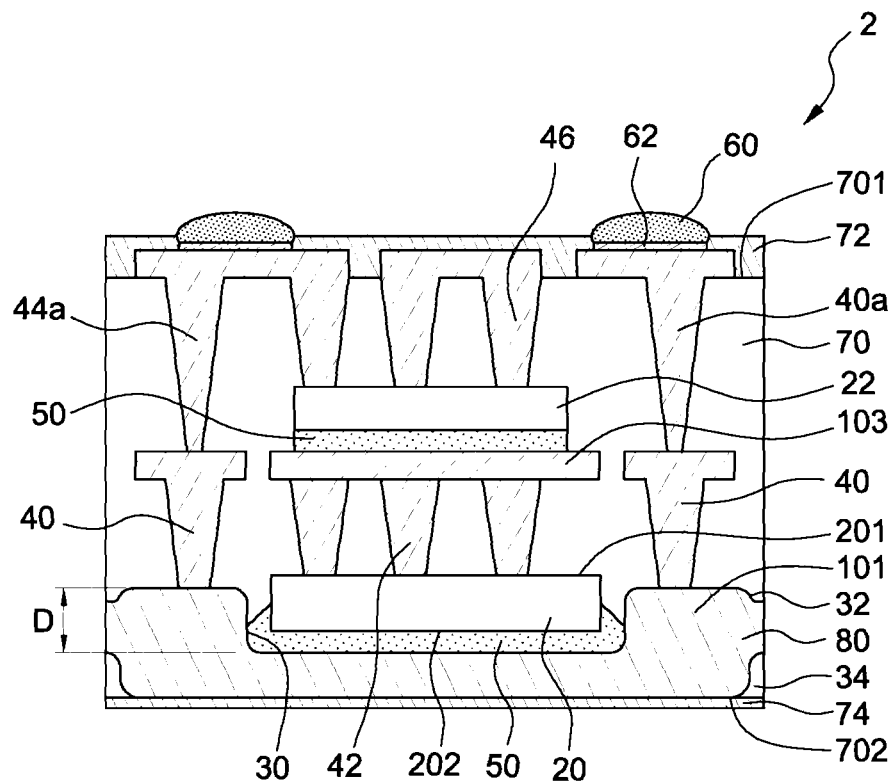
FIG. 1B is a cross-sectional view of a semiconductor device package in accordance with an embodiment of the present disclosure.

FIG. 1B is a cross-sectional view of a semiconductor device package 2 in accordance with an embodiment of the present disclosure. The semiconductor device package 2 includes conductive bases 101 and 103, semiconductor dies 20 and 22, conductive adhesive layers 50, protection layer 70 (which may be multiple protection layers 70), insulating layers 72 and 74, interconnection structures 40, 40a, 42, 44a and 46, conductive pads 62 and conductive connects 60. The semiconductor device package 2 is similar to the semiconductor device package 1 of FIG. 1A, and same-numbered components are not described again with respect to FIG. 1B.

The conductive base 103 is disposed above and electrically connected to the semiconductor die 20, and the semiconductor die 22 is bonded to and electrically connected to the conductive base 103. A width of the semiconductor die 22 is substantially the same as a width of the conductive adhesive layer 50 disposed between the semiconductor die 22 and the conductive base 103, and sidewalls of the semiconductor die 22 are respectively aligned with sidewalls of the conductive adhesive layer 50. The conductive adhesive layer 50 is a suitable adhesive film. In some embodiments, the conductive adhesive layer 50 disposed between the semiconductor die 22 and the conductive base 103 is not an epoxy material. The protection layer 70 is disposed on the conductive base 101, the semiconductor die 20, the conductive base 103 and the semiconductor die 22.

The interconnection structures 46 are electrically connected to the semiconductor die 22. The insulating layer 72 is disposed on the upper surface 701 of the protection layer 70 and over the interconnection structures 40a, 44a, 46. The conductive pads 62 are formed on and electrically connected to the interconnection structures 40a, 44a. The conductive connects 60 (e.g., solder balls) are disposed on respective conductive pads 62.

Figure 1C:
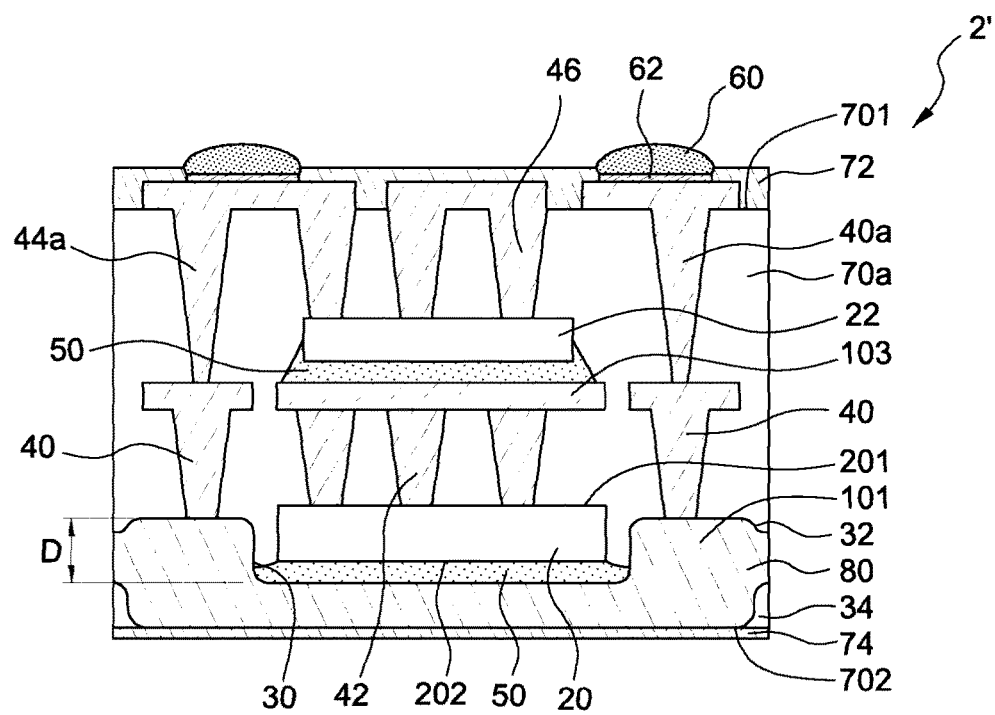
FIG. 1C is a cross-sectional view of a semiconductor device package in accordance with an embodiment of the present disclosure.

FIG. 1C is a cross-sectional view of a semiconductor device package 2' in accordance with an embodiment of the present disclosure. The semiconductor device package 2' includes conductive bases 101 and 103, semiconductor dies 20 and 22, conductive adhesive layers 50, a protection layer 70 (which may include multiple protection layers 70), insulating layers 72 and 74, interconnection structures 40, 42 and 46, conductive pads 62 and conductive connects 60.

The semiconductor device package 2' is similar to the semiconductor device package 2 of FIG. 1B, except that the conductive adhesive layer 50 between the semiconductor die 20 and the conductive base 103 is an epoxy film. The conductive adhesive layer 50 may contact a portion of each of the two sidewalls of the semiconductor die 22.

Figure 1D:
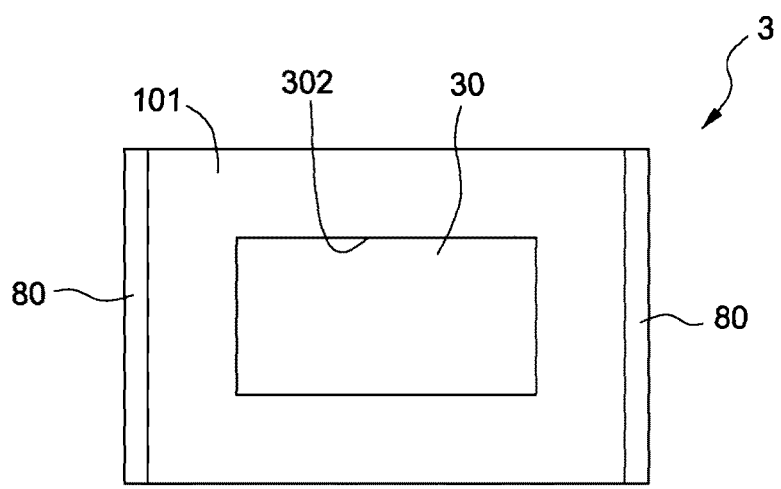
FIG. 1D illustrates a top view of the semiconductor device package 1 of FIG. 1A in accordance with an embodiment.

FIG. 1D is a top view illustration of a portion 3 of the semiconductor device package 1 of FIG. 1A in accordance with an embodiment of the present disclosure. The portion 3 is a portion of the conductive base 101 with the cavity 30. A shape of the cavity 30 from the top view is approximately rectangular (e.g., square). In this embodiment, the sidewall 302 of the cavity 30 is continuous in a lateral direction to form a complete rectangle. The protrusions 80 are on sidewalls of the conductive base 101.

Figure 1E:
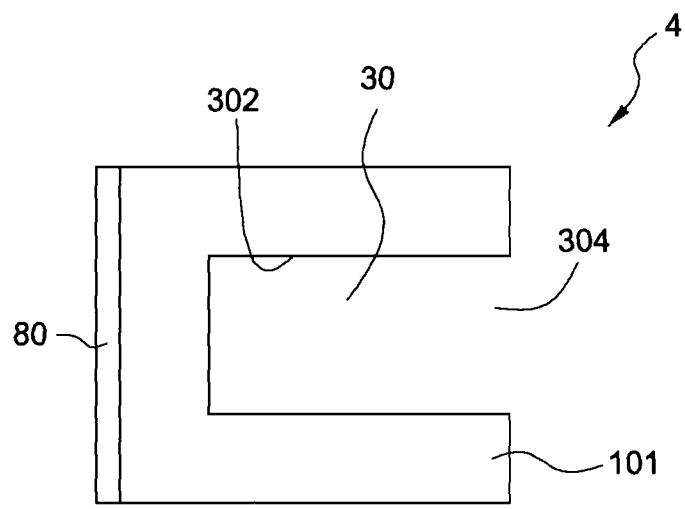
FIG. 1E illustrates a top view of the semiconductor device package 1 of FIG. 1A in accordance with an embodiment.

FIG. 1E is a top view illustration of a portion 4 of the semiconductor device package 1 of FIG. 1A in accordance with an embodiment of the present disclosure. The portion 4 is a portion of the conductive base 101 with the cavity 30. In this embodiment, the cavity 30 is surrounded on three sides by the conductive base 101 in a lateral direction, and the conductive base 101 defines an opening 304 where the sidewall 302 of the cavity 30 does not extend (e.g., at an edge of the semiconductor package device 1). In some embodiments, the opening 304 may be used to control a flow of the insulating material 34 during lamination of the protection layer 70.

Figure 1F:
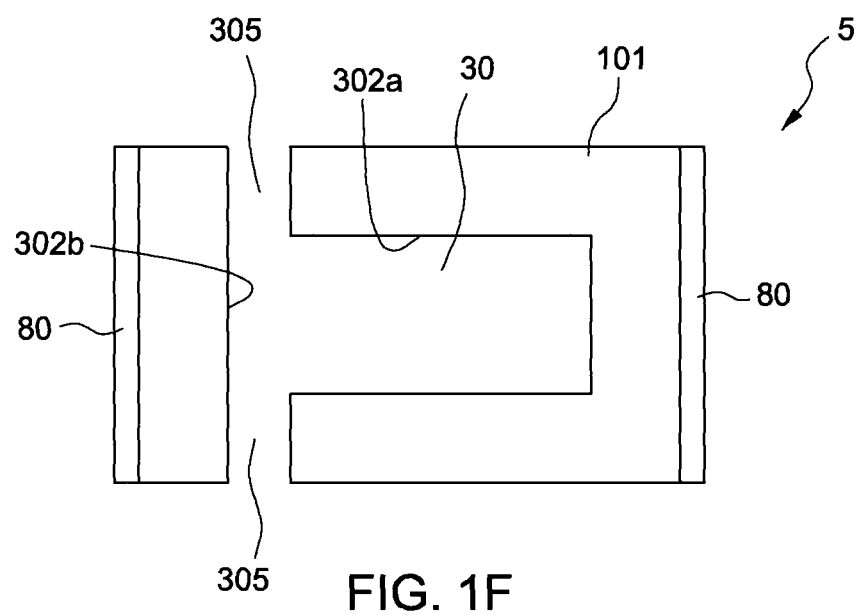
FIG. 1F illustrates a top view of the semiconductor device package 1 of FIG. 1A in accordance with an embodiment.

FIG. 1F is a top view illustration of a portion 5 of the semiconductor device package 1 of FIG. 1A in accordance with an embodiment of the present disclosure. The portion 5 is a portion of the conductive base 101 with the cavity 30. In this embodiment, the cavity 30 is surrounded on four sides by the conductive base 100, similarly to the embodiment of FIG. 1D, except that the conductive base 100 further defines openings 305 on two sides of the cavity 30. In some embodiments, the openings 305 may be used to control a flow of the insulating material 34 during lamination of the protection layer 70.

Figure 1G:
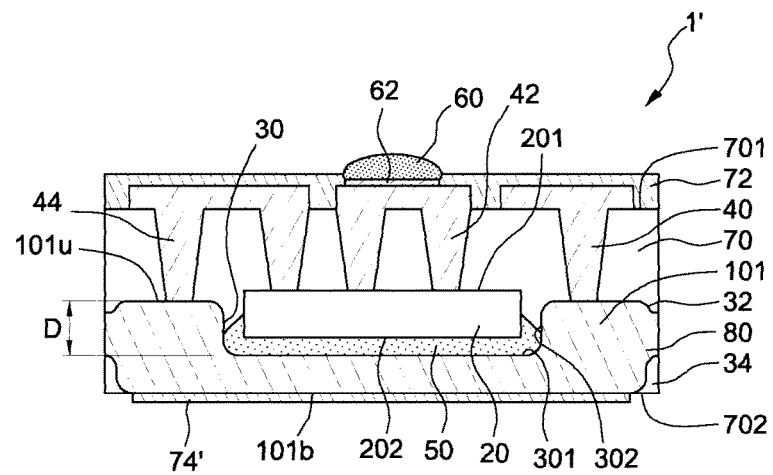
FIG. 1G is a cross-sectional view of a semiconductor device package in accordance with an embodiment of the present disclosure.

FIG. 1G is a cross-sectional view of a semiconductor device package 1' in accordance with an embodiment of the present disclosure. The semiconductor device package 1' is similar to the semiconductor device package 1 of FIG. 1A, and same-numbered components are not described again with respect to FIG. 1G. In FIG. 1G, the semiconductor device package 1' further includes a conductive layer 74' and the insulating layer 74 is omitted. A material of the conductive layer 74' may be, for example, nickel-gold or other suitable metal or alloy. In this embodiment, the conductive layer 74' is disposed on the surface 101b of the conductive base 101 and does not contact the insulating material 34.

Figure 2A:
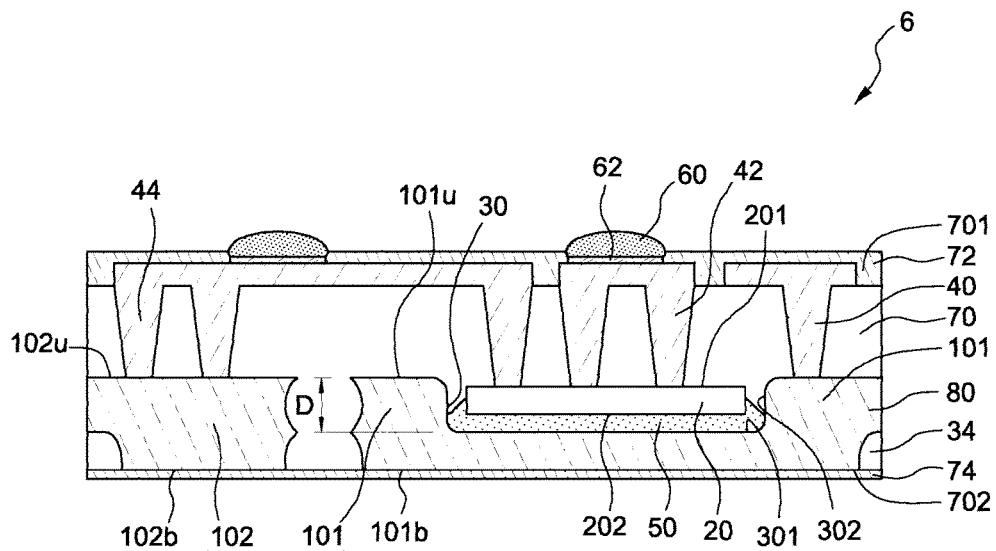
FIG. 2A is a cross-sectional view of a semiconductor device package in accordance with an embodiment of the present disclosure.

FIG. 2A is a cross-sectional view of a semiconductor device package 6 in accordance with an embodiment of the present disclosure. The semiconductor device package 6 is similar to the semiconductor device package 1 of FIG. 1A, and same-numbered components are not described again with respect to FIG. 2A. In FIG. 2A, an additional conductive base 102 is included, and the conductive base 102 is electrically connected to the semiconductor die 20 through the interconnection structure 44. In some embodiments, the entire structure of the conductive bases 101 and 102 may be a leadframe. A material of one or both of the conductive bases 101 and 102 is, for example, copper or other metal, or a metal alloy, or other conductive material. In the embodiment illustrated in FIG. 2A, the upper surface 201 of the semiconductor die 20 is lower than the upper surface 101u of the conductive base 101. A distance between the surface 201 of the semiconductor die 20 and the upper surface 101u of the conductive base 101 may be about 20% of the depth D of the cavity 30, or may be at least about 5% or at least about 10% of the depth D of the cavity 30, and up to about 35% or up to about 25% of the depth D of the cavity 30. In this embodiment, a sum of a thickness of the semiconductor die 20 and a thickness of the conductive adhesive layer 50 is less than the depth D of the cavity 30. The upper surface 201 of the semiconductor die 20 is lower than the upper surface 101u of the conductive base 101 to reduce or prevent damage to the semiconductor die 20 during lamination of the protection layer 70.

Figure 2B:
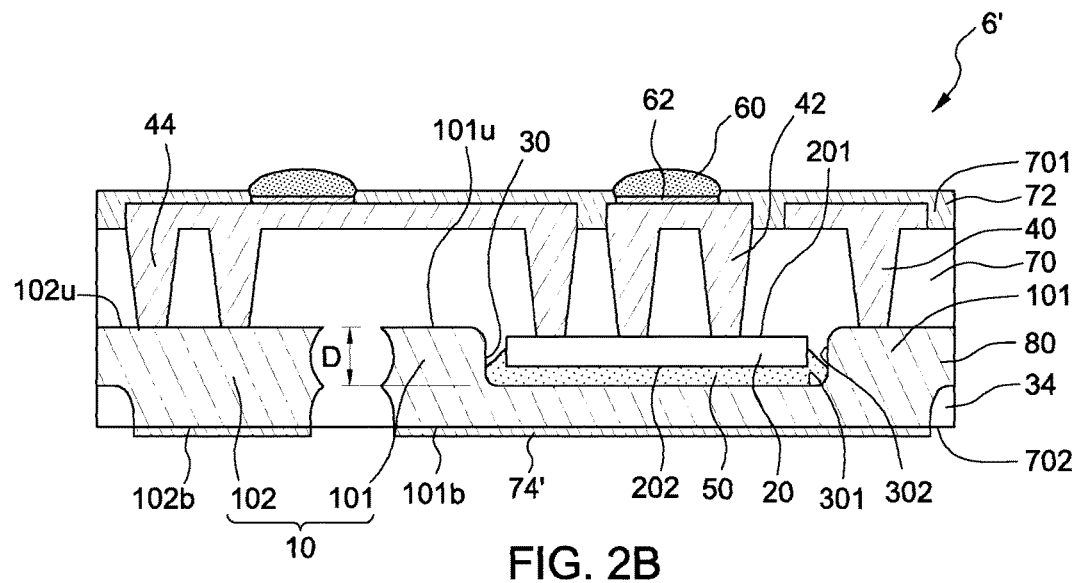
FIG. 2B is a cross-sectional view of a semiconductor device package in accordance with an embodiment of the present disclosure.

FIG. 2B is a cross-sectional view of a semiconductor device package 6' in accordance with an embodiment of the present disclosure. The semiconductor device package 6' is similar to the semiconductor device package 6 of FIG. 2A, and same-numbered components are not described again with respect to FIG. 2B. In FIG. 2B, the semiconductor device package 6' further includes a conductive layer 74' and the insulating layer 74 is omitted. A material of the conductive layer 74' may be, for example, nickel-gold or other suitable metal or alloy. In this embodiment, the conductive layer 74' is disposed on the surface 101b of the conductive base 101 and a surface 102b of the conductive base 102 and does not contact the insulating material 34.

Figure 3:
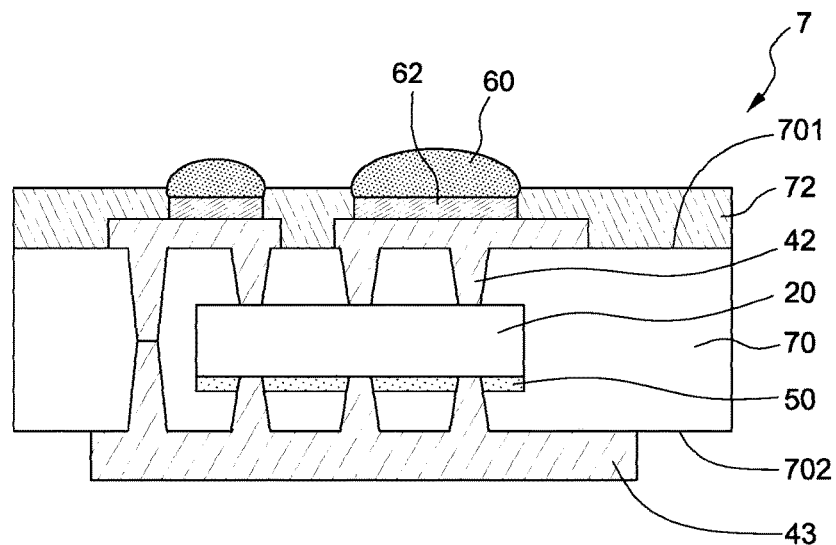
FIG. 3 is a cross-sectional view of a semiconductor device package in accordance with an embodiment of the present disclosure.

FIG. 3 is a cross-sectional view of a semiconductor device package 7 in accordance with an embodiment of the present disclosure. The semiconductor device package 7 includes a semiconductor die 20, a conductive adhesive layer 50, a protection layer 70, an insulating layer 72, interconnection structures 42 and 43, conductive pads 62 and conductive connects 60.

In some embodiments, the semiconductor die 20 is embedded in the protection layer 70. The semiconductor die 20 is bonded to the protection layer 70 through the conductive adhesive layer 50. The conductive adhesive layer 50 may be, for example, a conductive gel or epoxy film (epoxy mixed with a conductive material).

The protection layer 70 surrounds the semiconductor die 20. The semiconductor die 20 is electrically connected to the interconnection structures 42 and 43. In some embodiments, the interconnection structures 42 are vias formed in the protection layer 70 and the interconnection structures 43 are vias formed in the protection layer 70 and conductive adhesive layer 50. The conductive pads 62 are disposed on and electrically connected to the interconnection structures 42. A material of the conductive pads 62 may be, for example, copper or other metal, or a metal alloy, or other conductive material. Conductive connects 60 (e.g., solder balls) are disposed on respective conductive pads 62.

Figure 4:
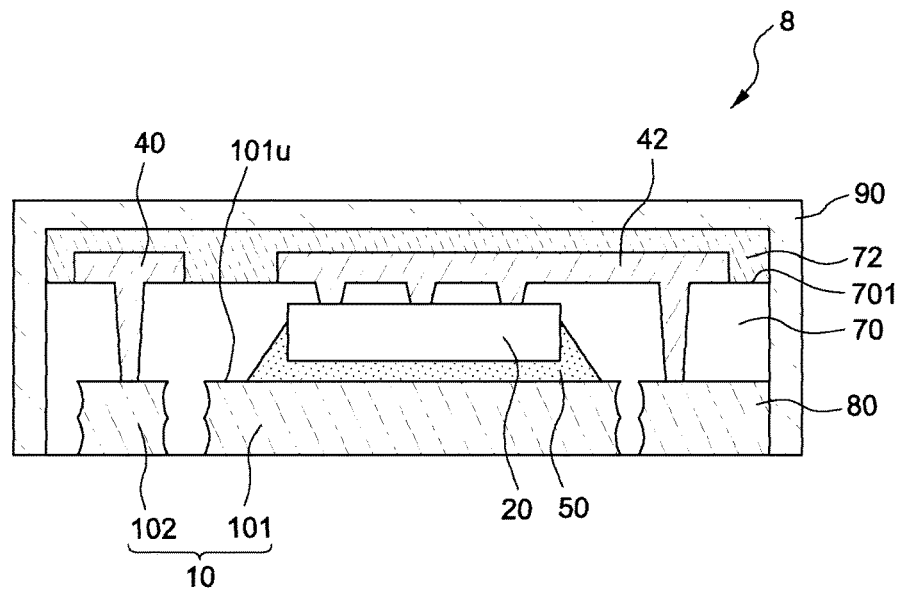
FIG. 4 is a cross-sectional view of a semiconductor device package in accordance with an embodiment of the present disclosure.

FIG. 4 is a cross-sectional view of a semiconductor device package 8 in accordance with an embodiment of the present disclosure. The semiconductor device package 8 is similar to the semiconductor device package 6 of FIG. 2A, and same-numbered components are not described again with respect to FIG. 4. In FIG. 4, the insulating layer 74 and the cavity 30 in the conductive base 101 as shown in FIG. 2A are omitted. That is, the semiconductor die 20 is disposed on the upper surface 101u of the conductive base 101 through the conductive adhesive layer 50. In addition, a protection layer 90 is disposed to cover the insulating layer 72, sidewalls of the protection layer 70 and the protrusions 80 of the conductive base 101. A material of the protection layer 90 may be a polypropylene resin, although other insulating materials may be used additionally or alternatively.

Figure 5:
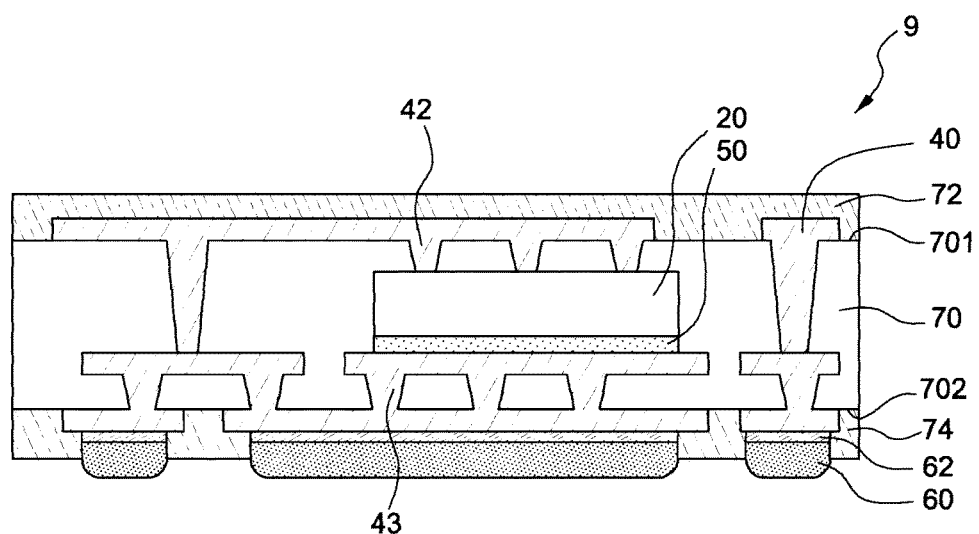
FIG. 5 is a cross-sectional view of a semiconductor device package in accordance with an embodiment of the present disclosure.

FIG. 5 is a cross-sectional view of a semiconductor device package 9 in accordance with an embodiment of the present disclosure. The semiconductor device package 9 is similar to the semiconductor device package 7 of FIG. 3, and same-numbered components are not described again with respect to FIG. 5. In FIG. 5, an insulating layer 74 is disposed on the surface 702 of the protection layer 70. The conductive pads 62 and conductive connects 60 are disposed below the semiconductor die 20 and conductive adhesive layer 50. The conductive connects 60 are partially exposed from the insulating layer 74. Accordingly, electrical connection (e.g., for signal transmission) can be made from the pads of semiconductor die 20 to the conductive connects 60 through the interconnection structures 42 and 43.

FIGS. 6A-6H illustrate a method for manufacturing the semiconductor device package 1 of FIG. 1A.

Figure 6A:
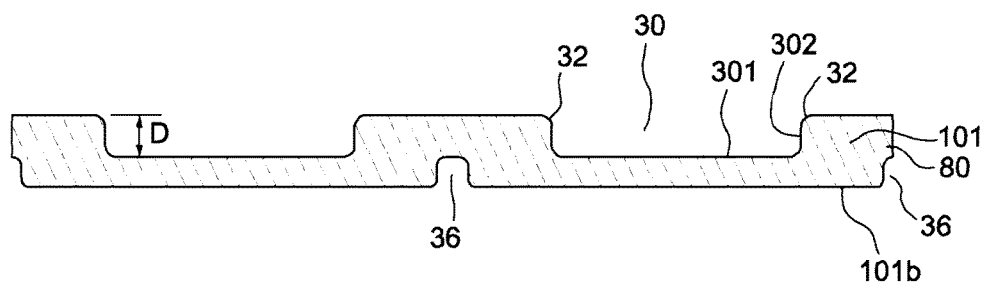
FIG. 6A, FIG. 6B, FIG. 6C, FIG. 6D, FIG. 6E, FIG. 6F, FIG. 6G and FIG. 6H illustrate a method of manufacturing the semiconductor device package of FIG. 1.

Referring to FIG. 6A, a conductive base 101 is provided. The conductive base 101 includes an upper surface 101u and a surface 101b opposite to the upper surface 101u. The material of the conductive base 101 is, for example, copper or other metal, or a metal alloy, or other conductive material. Vias 36 are defined from the surface 101b of the conductive base 101. At least one cavity 30 is defined from the upper surface 101u of the conductive base 101. The cavity 30 has at least one sidewall 302 and a depth D to a bottom surface 301 of the cavity. In some embodiments, the depth D may be about 80 μm to about 120 μm. In some embodiments, the conductive base 101 is provided with the cavity 30 and is not etched to form the cavity 30. That is, the upper surface 101u of the conductive base 101 is not removed by an etching technique. The unetched structure of the conductive base 101, which may provide a relatively robust or strong structure, is relatively easier to be handled to facilitate subsequent electrical measurements/tests.

Figure 6B:
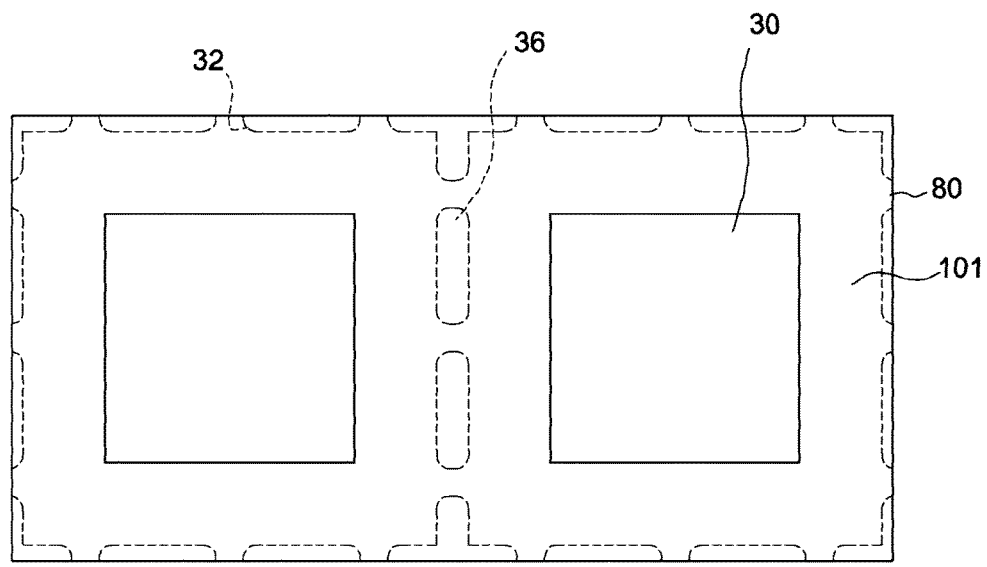

The conductive base 101 includes one or more protrusions 80. Corners 32 of the conductive base 101 are smoothed to redistribute stress to avoid damage to the protection layer 70 during lamination. FIG. 6B illustrates a top view of the conductive base 101 in accordance with an embodiment. As can be seen in FIG. 6B, the corners 32 are rounded in top view in addition to being rounded from a cross-sectional view, and the vias are also smoothed, to avoid sharp corners of the conductive base 101 which can lead to stress and corresponding damage of a protection layer during a subsequent lamination stage.

Figure 6C:
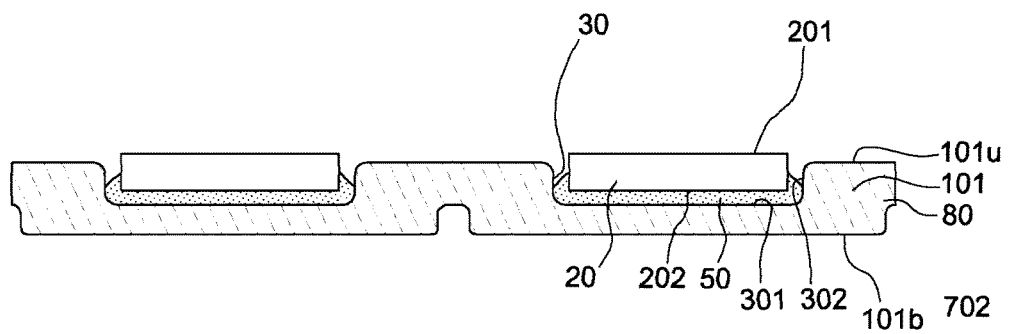

Referring to FIG. 6C, a conductive adhesive layer 50 is disposed on a bottom surface 301 of the cavity 30. The conductive adhesive layer 50 may be, for example, a conductive gel or epoxy film (epoxy mixed with a conductive material). A semiconductor die 20 is disposed on the conductive adhesive layer 50 in each cavity 30. The conductive adhesive 50 is used to attach the semiconductor die 20 to the bottom surface 301 of the cavity 30.

Figure 6D:
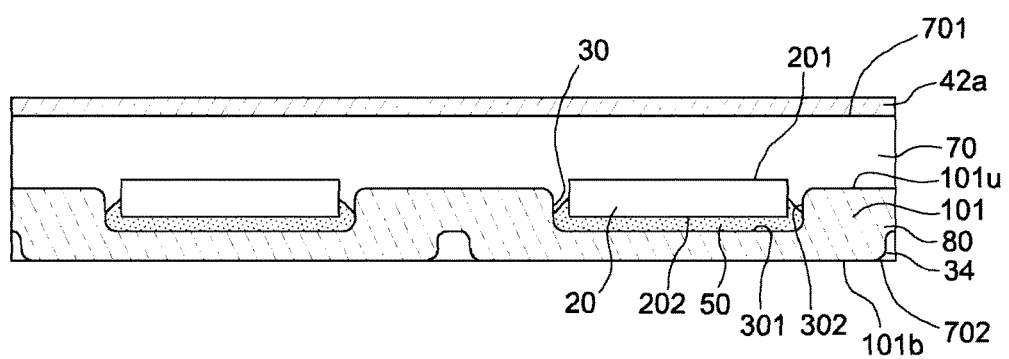

Referring to FIG. 6D, a protection layer 70 is formed on the conductive base 101 and the semiconductor die 20 by a lamination technique. A material of the protection layer 70 may be, for example, a polypropylene resin or other suitable material. A portion of the protection layer 70 is melted during lamination. The design of the conductive base 101 may control the flow of the melting material to form the protection layer 70. The design of the conductive base 101 without etching the upper surface 101*u* of the conductive base 101 can, for example, prevent the melting material to form the protection layer 70 from flowing into scribe lines (not shown).

A conductive layer 42*a* is disposed on an upper surface 701 of the protection layer 70 by coating, sputtering, plating or another suitable technique. In one or more embodiments, the conductive layer 42*a* includes aluminum or copper, or an alloy thereof (such as AlCu). An insulating material 34 is disposed to fill the vias 36.

Figure 6E:
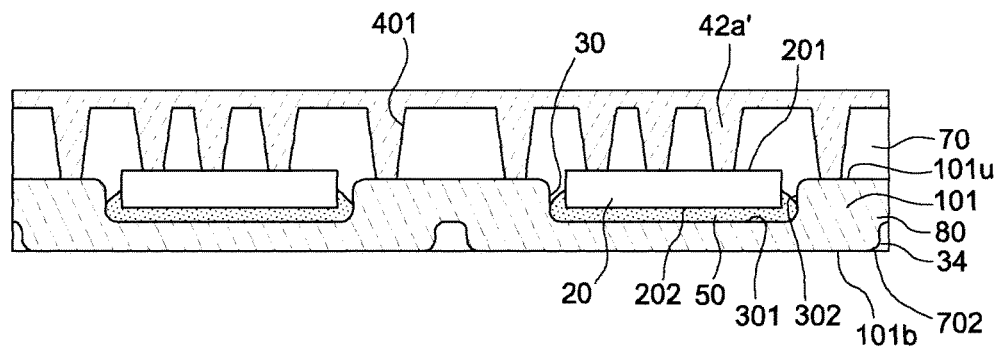

Referring to FIG. 6E, vias 401 are formed through the protection later 70 from the upper surface 701 of the protection layer 70. A conductive layer 42*a*' is formed over the conductive layer 42*a* and in the vias 401 by coating, sputtering, plating or another suitable technique. The conductive layer 42*a*' is connected to the conductive base 101 and the semiconductor die 20. In one or more embodiments, the conductive layer 42*a*' includes aluminum or copper, or an alloy thereof (such as AlCu).

Figure 6F:
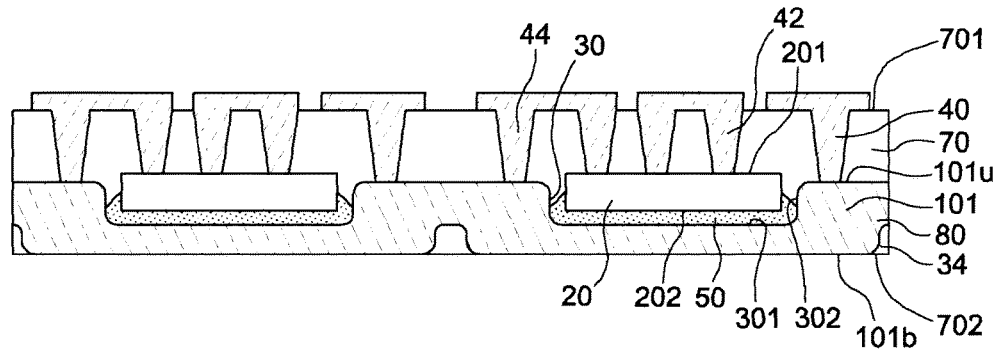

Referring to FIG. 6F, interconnection structures 40, 42 and 44 are formed, such as by etching. A material of interconnection structures 40, 42 and 44 is, for example, copper or other metal, or a metal alloy, or other conductive material. The interconnection structure 42 is electrically connected to a pad on an upper surface 201 of the semiconductor die 20. The interconnection structure 40 is electrically connected to the upper surface 101*u* of the conductive base 101. The interconnection structure 44 is electrically connected to the upper surface 101*u* of the conductive base 101 and to a pad on the upper surface 201 of the semiconductor die 20.

Figure 6G:
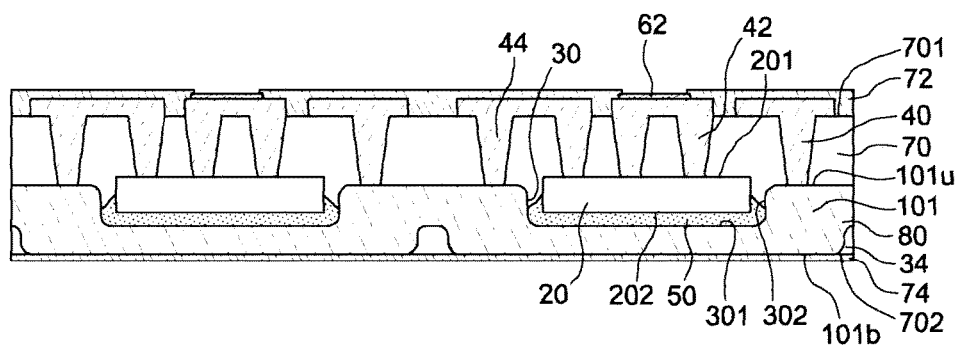

Referring to FIG. 6G, an insulating layer 72 is disposed on the upper surface 701 of the protection layer 70 and covers interconnection structures 40, 42 and 44. An insulating layer 74 is formed on a surface 702 of the protection layer 70, the surface 101*b* of the conductive base 101, and the insulating material 34. A material of the insulating layers 72 and 74 may be polypropylene resin; however, other insulating materials may be used additionally or alternatively. The insulating material 34 in the vias 36 can reduce or avoid damage to the insulating layer 74 during separation (singulation). In embodiments in which a material of the layer 74 is nickel-gold or other suitable conductive materials, the layer 74 will be formed on the surface 101*b* of the conductive base 101 but not contact the insulating material 34.

Figure 6H:
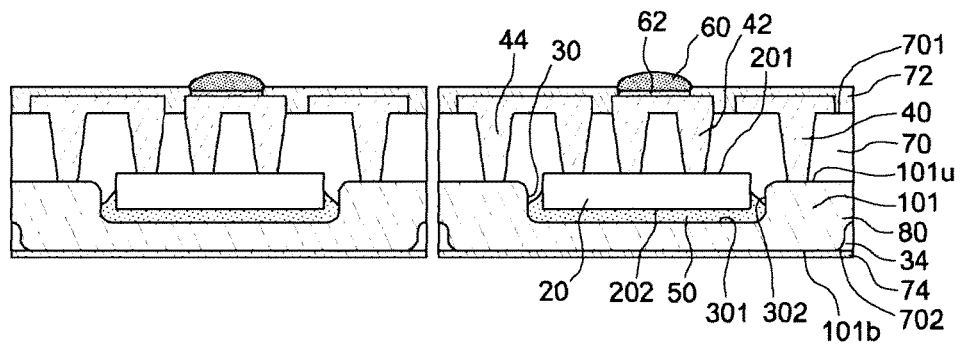

Referring to FIG. 6H, at least one conductive pad 62 is formed on the interconnection structure 42. A material of the conductive pad 62 may be, for example, copper or other metal, or a metal alloy, or other conductive material. At least one conductive connect 60 (e.g., solder ball) is formed on the conductive pad 62. In the embodiment illustrated in FIG. 6H, two or more semiconductor device packages 1 are fabricated concurrently, and then are separated, such as by sawing or etching techniques through the protrusion 80 of the conductive base 101.

FIGS. 7A-7H illustrate a method for manufacturing the semiconductor device package 7 of FIG. 3.

Figure 7A:
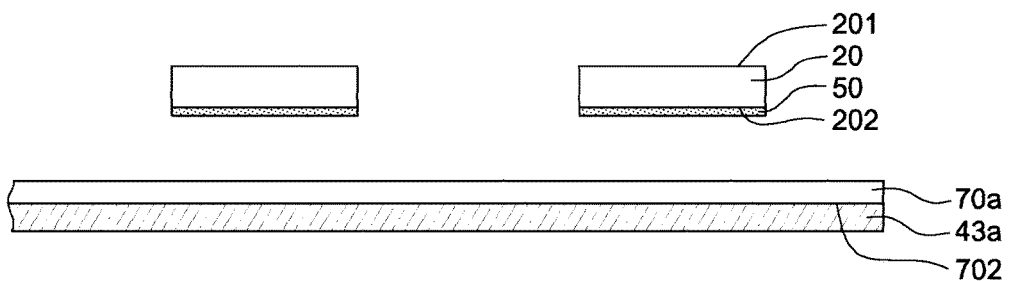
FIG. 7A, FIG. 7B, FIG. 7C, FIG. 7D, FIG. 7E, FIG. 7F, FIG. 7G, and FIG. 7H illustrate a method of manufacturing the semiconductor device package of FIG. 3.

Referring to FIG. 7A, at least one semiconductor die 20 and an insulating layer 70*a* are provided. At least one conductive adhesive layer 50 is disposed on a surface 202 of the semiconductor die 20. A conductive layer 43*a* is attached to a surface 702 of the insulating layer 70*a*. A material of the conductive layer 43*a* is, for example, copper or other metal, or a metal alloy, or other conductive material. The conductive adhesive layer 50 may be, for example, a conductive gel or epoxy film (epoxy mixed with a conductive material). A material of the insulating layer 70*a* may be, for example, a polypropylene resin or other suitable material.

Figure 7B:
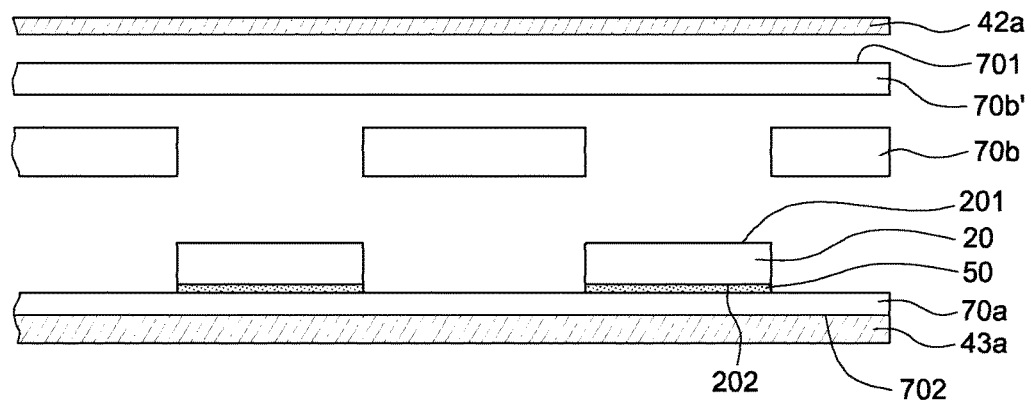

Referring to FIG. 7B, the semiconductor die 20 is attached on the insulating layers 70*a* by the conductive adhesive layer 50. A patterned insulating layer 70*b* defines through holes for receiving the semiconductor die 20, and the patterned insulating layer 70*b* is disposed by lamination to cover the insulating layer 70*a*. Next, an insulating layer 70*b*' is disposed to cover the semiconductor dies 20 and the patterned insulating layer 70*b*. A conductive layer 42*a* is attached to an upper surface 701 of the insulating layer 70*b*. A material of the conductive layer 42*a* is, for example, copper or other metal, or a metal alloy, or other conductive material. A material of the insulating layers 70*b* may be, for example, a polypropylene resin or other suitable material.

Figure 7C:
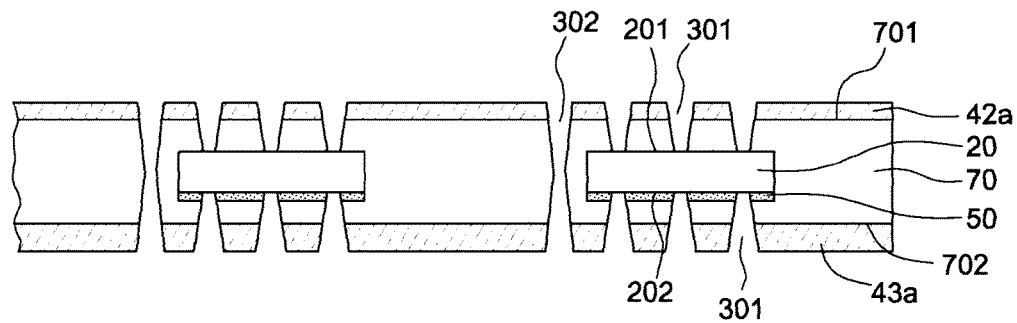

Referring to FIG. 7C, the insulating layers 70*a*, 70*b* and 70*b*' are combined to form a protection layer 70 by a lamination technique. At least one via 301 and at least one through-hole 302 are formed from the surface of the conductive layer 42*a* and from the conductive layer 43*a*. The vias 301 expose pads of the semiconductor die 20. The through-holes 302 pass through the conductive layer 42*a*, the protection layer 70 and the conductive layer 43*a*. The vias 301 and through-holes 302 may be formed, for example, by drilling.

Figure 7D:
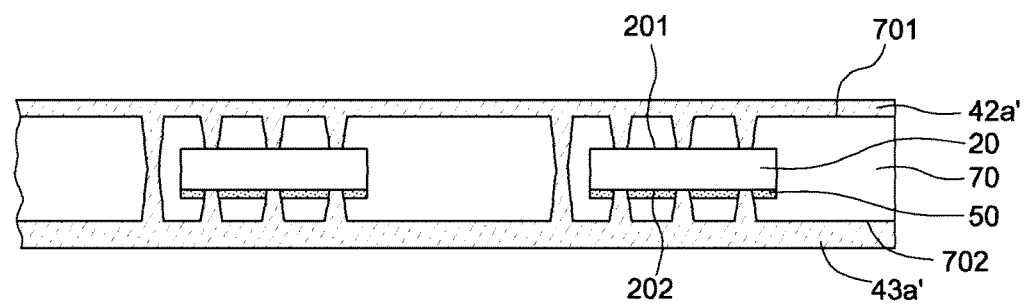

Referring to FIG. 7D, a conductive layer 42*a*' is formed over the conductive layer 42*a* and in the vias 301, and a conductive layer 43*a*' is formed over the conductive layer 43*a*' and in the vias 301, such as by coating, sputtering, plating or another suitable technique. The conductive layer 42*a*' and the conductive layer 43*a*' together fill the through-holes 302. The conductive layers 42*a*' and 43*a*' include aluminum or copper, or an alloy thereof (such as AlCu).

Figure 7E:
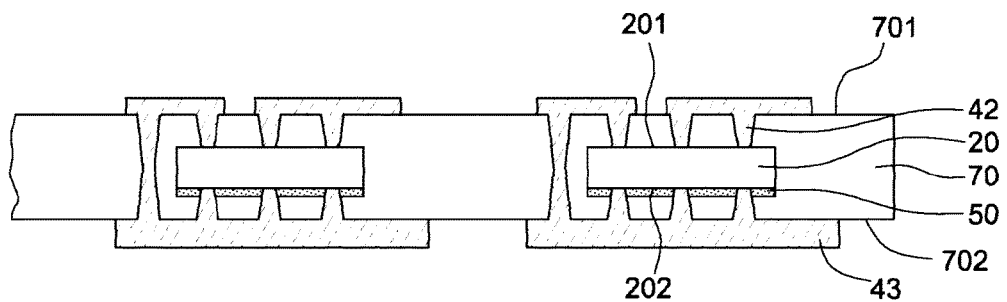

Referring to FIG. 7E, interconnection structures 42 and 43 are formed by etching respectively the conductive layer 42*a*' and the conductive layer 43*a*'. The interconnection structure 42 is electrically connected to a pad on an upper surface 201 of the semiconductor die 20. Interconnection structure 43 is electrically connected to pads on a surface 202 of the semiconductor die 20. Interconnection structures 42 and 43 are electrically connected by the conductive layer 42*a*' and the conductive layer 43*a*' in the through-holes 302.

Figure 7F:
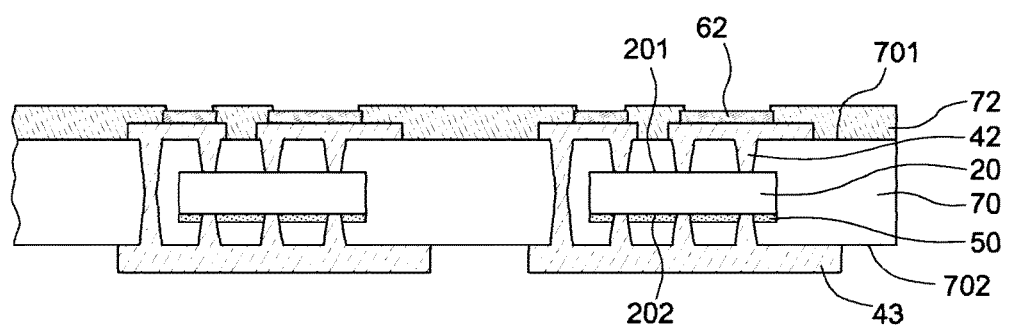

Referring to FIG. 7F, an insulating layer 72 is disposed on the upper surface 701 of the protection layer 70 and covers the interconnection structure 42. A material of the insulating layer 72 may be polypropylene resin; however, other insulating materials may be used additionally or alternatively.

Figure 7G:
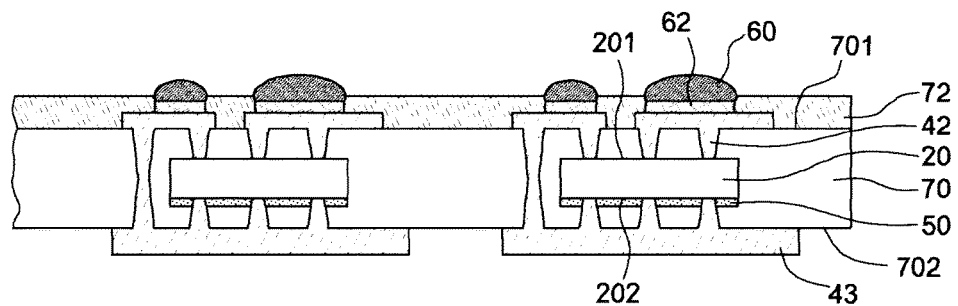

Referring to FIG. 7G, at least one conductive pad 62 is formed on the interconnection structure 42. A material of the conductive pad 62 may be, for example, copper or other metal, or a metal alloy, or other conductive material. At least one conductive connect 60 (e.g., solder ball) is formed on the conductive pad 62.

Figure 7H:
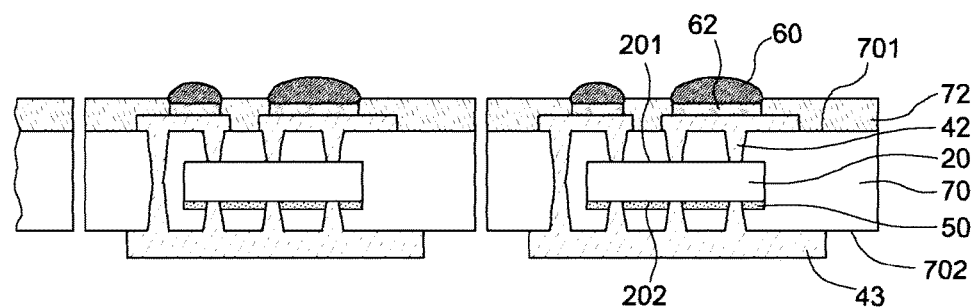

Referring to FIG. 7H, in the embodiment illustrated, two semiconductor device packages 3 are separated by sawing or etching techniques.

In the embodiment illustrated in FIG. 7H, two or more semiconductor device packages 7 are fabricated concurrently, and then are separated, such as by sawing or etching techniques.

FIGS. 8A-8G illustrate a method of manufacturing the semiconductor device package 8 of FIG. 4.

Figure 8A:
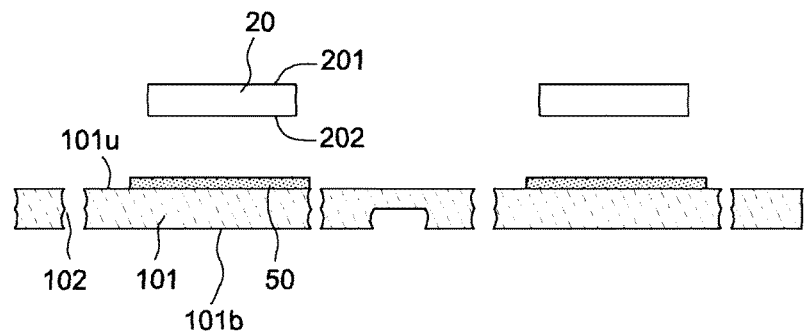
FIG. 8A, FIG. 8B, FIG. 8C, FIG. 8D, FIG. 8E, FIG. 8F, and FIG. 8G illustrate a method of manufacturing the semiconductor device package of FIG. 4.

Referring to FIG. 8A, a conductive base 101 and a conductive base 102 are provided. The conductive base 101 includes an upper surface 101*u* and a surface 101*b* opposite to the upper surface 101*u*. A material of the conductive base 101 is, for example, copper or other metal, or a metal alloy, or other conductive material. Some corners 32 of the conductive bases 101 and 102 are smoothed. At least one semiconductor die 20 is provided. At least one conductive adhesive 50 is disposed on the upper surface 101*u* of the conductive base 101. The conductive adhesive layer 50 may be, for example, a conductive gel or epoxy film (epoxy mixed with a conductive material).

Figure 8B:
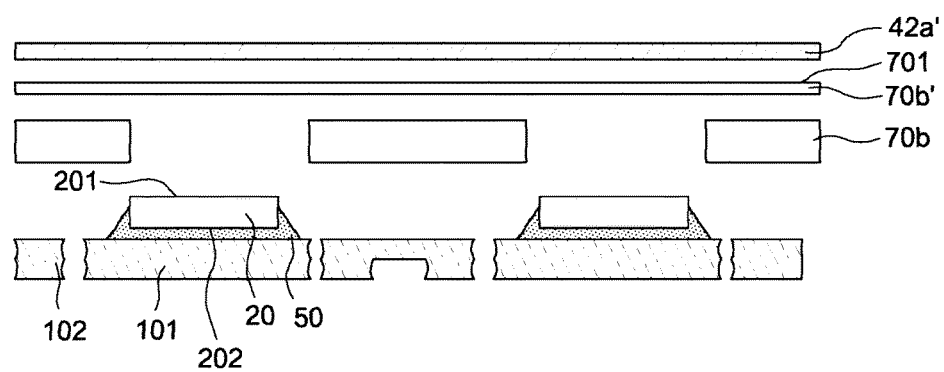

Referring to FIG. 8B, the semiconductor die 20 is bonded to the upper surface 101*u* of the conductive base 101 by the conductive adhesive layer 50. A patterned insulating layer 70*b* defines through holes for receiving the semiconductor die 20. The patterned insulating layer 70*b* is disposed by a lamination technique to cover the conductive bases 101 and 102 and a portion of the conductive adhesive layer 50.

An insulating layer 70*b'* is disposed to cover the semiconductor dies 20 and the conductive bases 101, 102. A conductive layer 42*a'* is disposed on the upper surface 701 of the insulating layer 70*b'*. A material of the conductive layer 42*a'* is, for example, copper or other metal, or a metal alloy, or other conductive material. A material of the insulating layers 70*b*, 70*b'* may be, for example, a polypropylene resin or other suitable material.

Figure 8C:
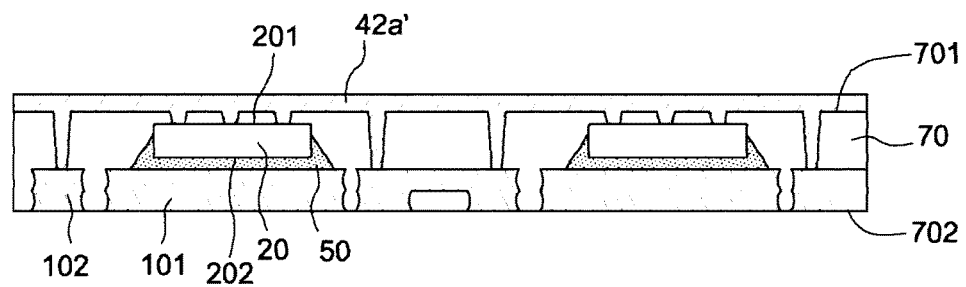

Referring to FIG. 8C, a protection layer 70 is formed on the conductive bases 101 and 102 and the semiconductor die 20 from the insulating layers 70*b*, 70*b'* by a lamination technique. A portion of the protection layer 70 is melted during lamination. The conductive layer 42*a'* is connected to the conductive bases 101 and 102 and the semiconductor die 20. In one or more embodiments, the conductive layer 42*a'* includes one or more of aluminum or copper, or an alloy thereof (such as AlCu).

Figure 8D:
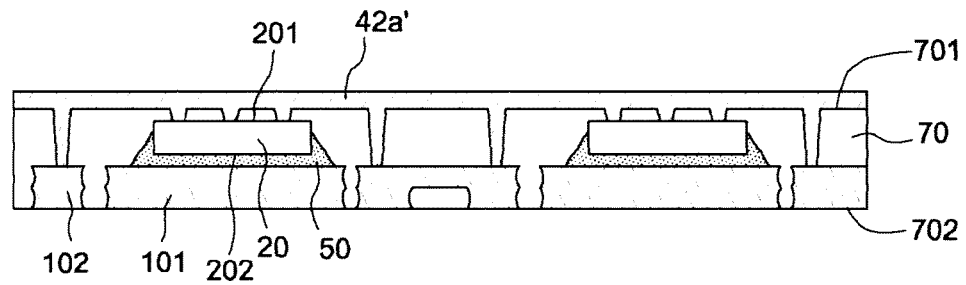

Referring to FIG. 8D, a second conductive layer may optionally be formed over the conductive layer 42*a'* by coating, sputtering, plating or another suitable technique.

Figure 8E:
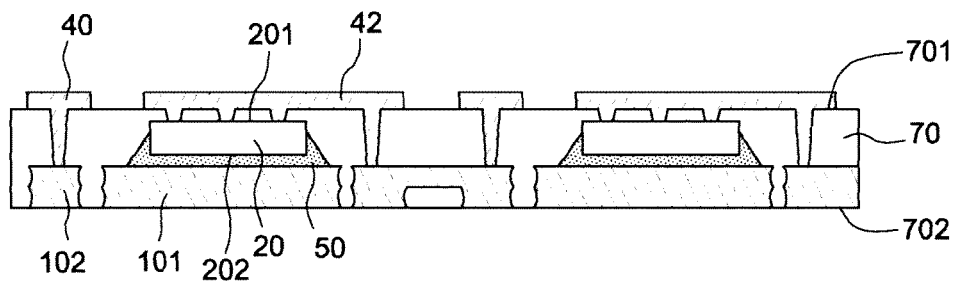

Referring to FIG. 8E, interconnection structures 40 and 42 are formed by etching. The interconnection structure 42 is electrically connected to pads on the upper surface 201 of the semiconductor die 20. Interconnection structure 40 is electrically connected to the conductive base 102. A material of interconnection structures 40 and 42 is, for example, copper or other metal, or a metal alloy, or other conductive material.

Figure 8F:
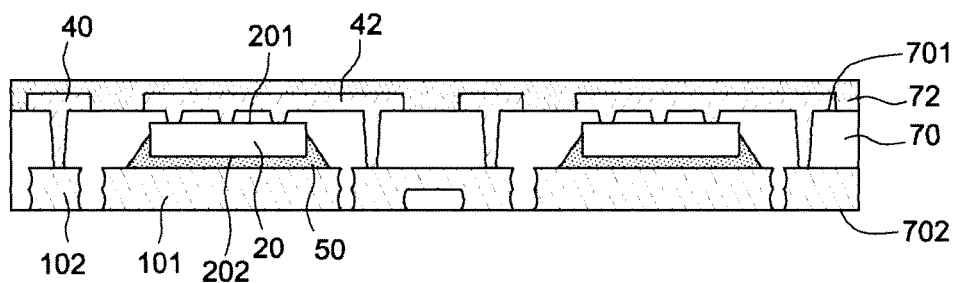

Referring to FIG. 8F, an insulating layer 72 is disposed on the upper surface 701 of the protection layer 70 and covers interconnection structures 40 and 42. A material of the insulating layer 72 may be polypropylene resin; however, other insulating materials may be used additionally or alternatively.

Figure 8G:
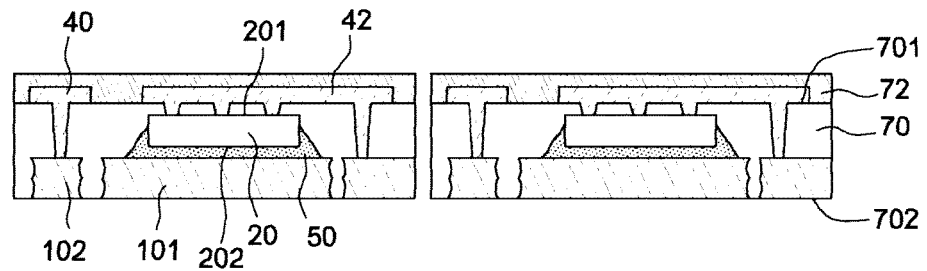

Referring to FIG. 8G, in the embodiment illustrated, two semiconductor device packages 8 are separated by sawing or etching techniques.

FIG. 9A-9F illustrate a method of manufacturing the semiconductor device package 9 of FIG. 5.

Figure 9A:
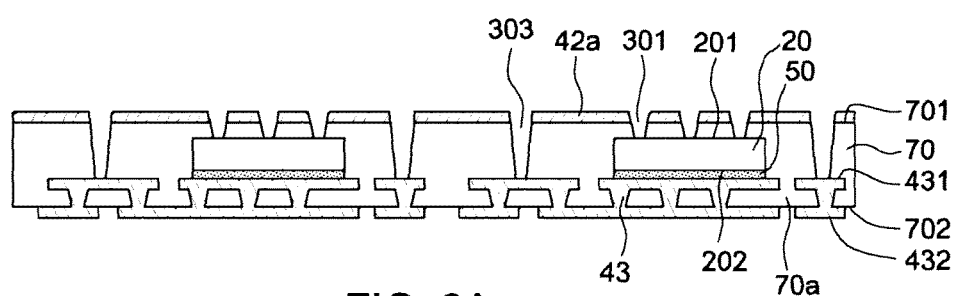
FIG. 9A, FIG. 9B, FIG. 9C, FIG. 9D, FIG. 9E and FIG. 9F illustrate a method of manufacturing the semiconductor device package of FIG. 5.

Referring to FIG. 9A, at least one semiconductor die 20 is provided. At least one conductive adhesive layer 50 is disposed on a surface 202 of the semiconductor die 20. The conductive adhesive layer 50 may be, for example, a conductive gel or epoxy film (epoxy mixed with a conductive material). The semiconductor die 20 is attached to a conductive layer 43 by the adhesive layer 50. The conductive layer 43 includes an upper surface 431 and a surface 432 opposite to the upper surface 431. A material of the conductive layer 43 is, for example, copper or other metal, or a metal alloy, or other conductive material. A protective layer 70 covers the semiconductor die 20 and the conductive layer 43. A conductive layer 42*a* is disposed over the protective layer 70. Vias 301 and through-holes 303 are formed through the protective layer 70 and the conductive layer 42*a*. An insulating layer 70*a* is embedded in the conductive layer 43. A material of the insulating layer 70*a* may be, for example, a polypropylene resin or other suitable material.

Figure 9B:
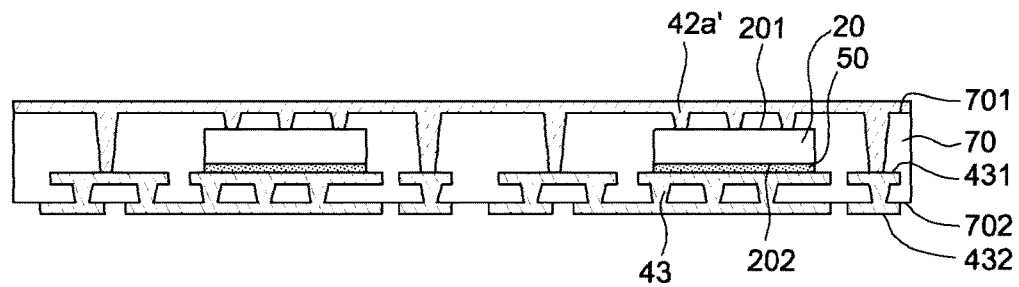

Referring to FIG. 9B, a conductive layer 42*a'* is formed over the conductive layer 42 and in the vias 301 and through-holes 303 by coating, sputtering, plating or another suitable technique. In one or more embodiments, the conductive layer 42*a'* includes one or more of aluminum or copper, or an alloy thereof (such as AlCu).

Figure 9C:
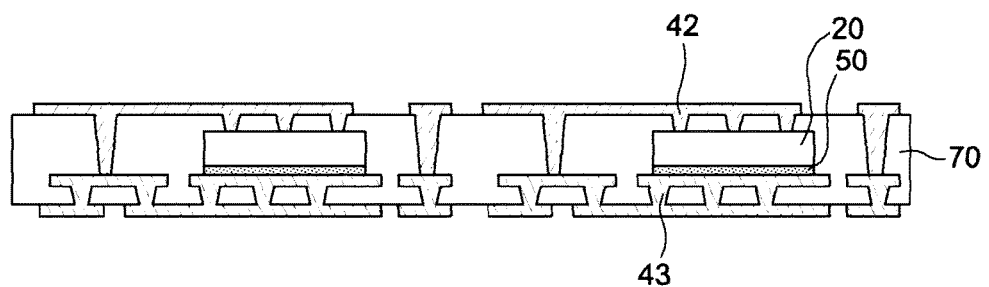

Referring to FIG. 9C, a plurality of interconnection structures 42 and 43 are formed by etching. The interconnection structure 42 is electrically connected to pads on an upper surface 201 of the semiconductor die 20. The interconnection structure 43 is electrically connected to the interconnection structure 42 and the surface 202 of the semiconductor die 20. A material of interconnection structures 42 and 43 is, for example, copper or other metal, or a metal alloy, or other conductive material.

Figure 9D:
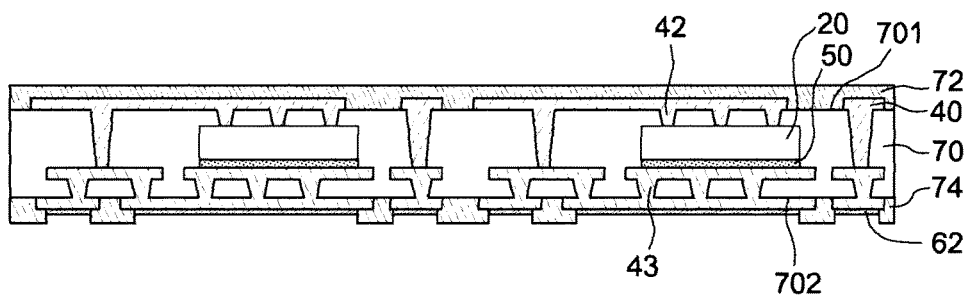

Referring to FIG. 9D, an insulating layer 72 is disposed on an upper surface 701 of the protection layer 70 and covers the interconnection structure 42. A material of the insulating layer 72 may be polypropylene resin; however, other insulating materials may be used additionally or alternatively. At least one conductive pad 62 is formed on the interconnection structures 43. A material of the conductive pad 62 may be, for example, copper or other metal, or a metal alloy, or other conductive material.

Figure 9E:
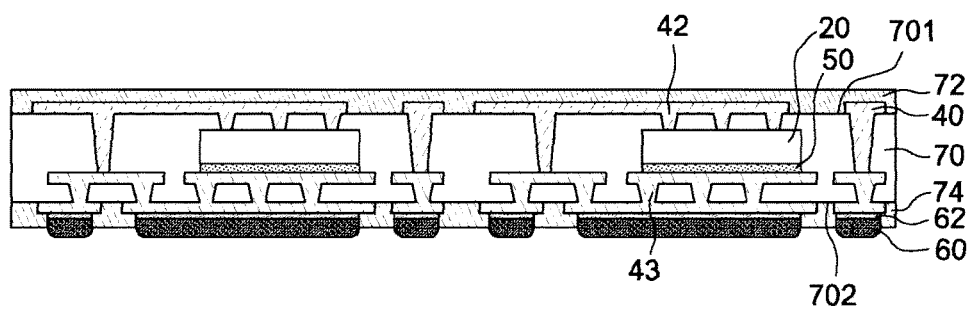

Referring to FIG. 9E, at least one conductive connect 60 (e.g., solder ball) is formed on the conductive pad 62.

Figure 9F:
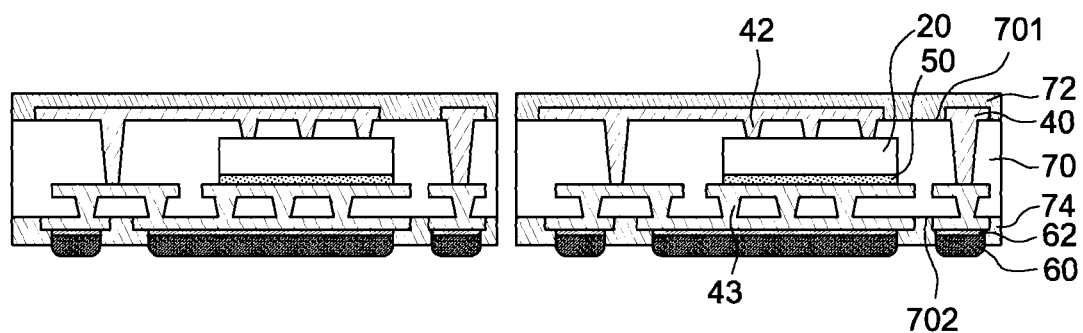

Referring to FIG. 9F, in the embodiment illustrated, two semiconductor device packages 9 are separated by sawing or etching techniques.

Figure 10A:
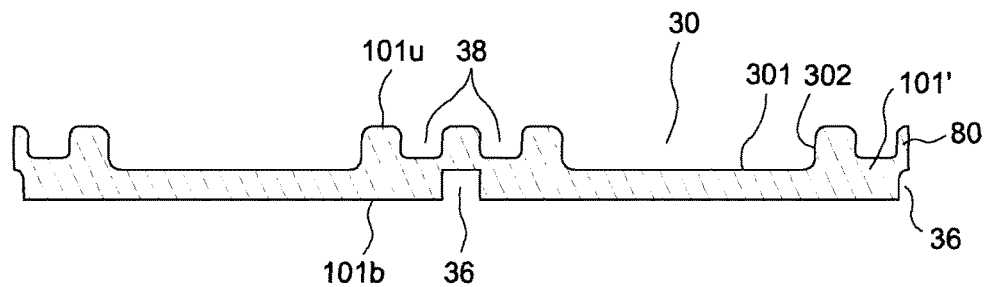
FIG. 10A illustrates a cross-sectional view of a conductive base in accordance with an embodiment of FIG. 6A.

FIG. 10A illustrates a cross-sectional view of a conductive base 101' in accordance with an embodiment, where the conductive base 101' replaces the conductive base 101 in FIG. 6A. The conductive base 101' of FIG. 10A is similar to the conductive base 101 of FIG. 6A, except that vias 38 are defined from the surface 101*u* of the conductive base 101' in FIG. 10A.

Figure 10B:
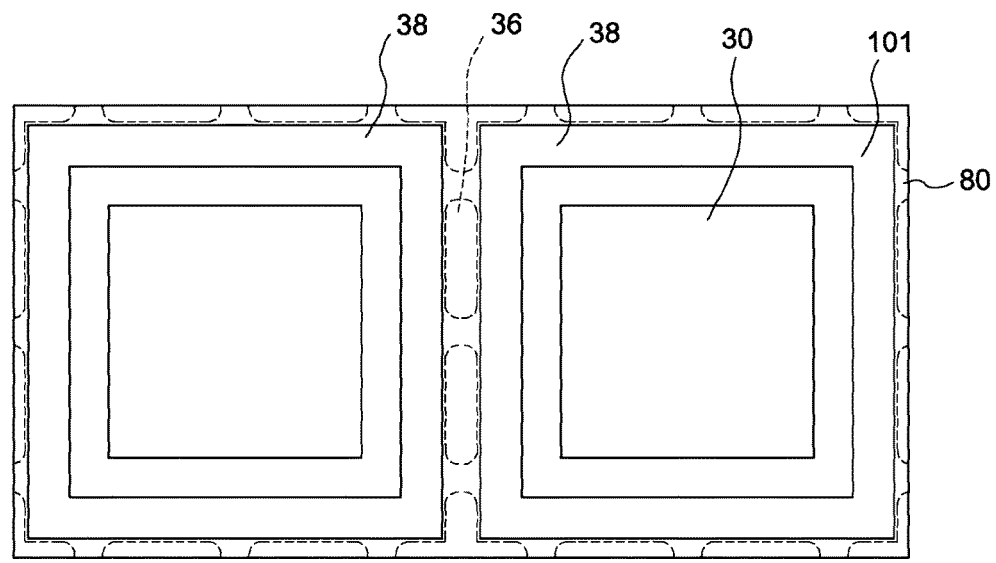
FIG. 10B illustrates a top view of the conductive base in accordance with an embodiment of FIG. 10A.

FIG. 10B illustrates a top view of the conductive base 101' of FIG. 10A in accordance with an embodiment. In this embodiment, at least one corner of each of the vias 38 is smoothed.

Figure 11A:
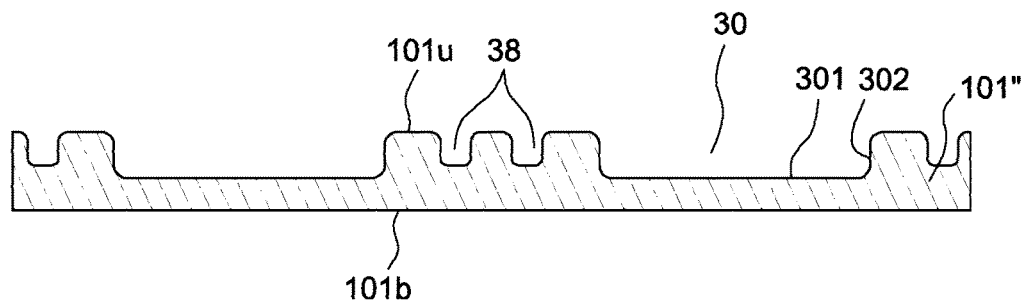
FIG. 11A illustrates a cross-sectional view of a conductive base in accordance with an embodiment of FIG. 6A.

FIG. 11A illustrates a cross-sectional view of a conductive base 101" in accordance with an embodiment, where the conductive base 101" replaces the conductive base 101 in FIG. 6A. The conductive base 101" of FIG. 11A is similar to the conductive base 101 of FIG. 6A, except that vias 38 are defined from the surface 101*u* of the conductive base 101", and the vias 36 are omitted.

Figure 11B:
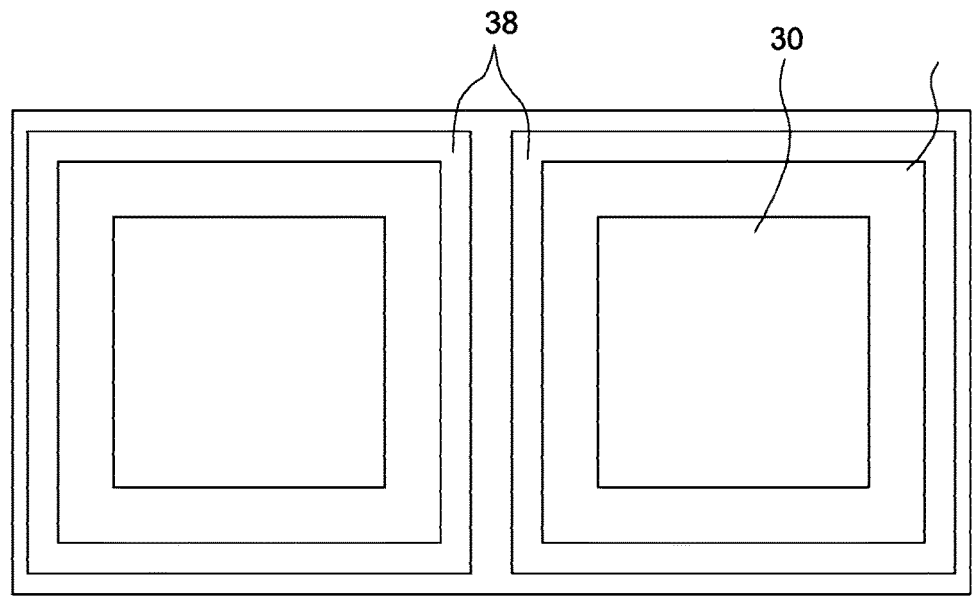
FIG. 11B illustrates a top view of the conductive base in accordance with an embodiment of FIG. 11A.

FIG. 11B illustrates a top view of the conductive base 101" of FIG. 11A in accordance with an embodiment. In this embodiment, at least one corner of each of the vias 38 is smoothed.

Figure 12A:
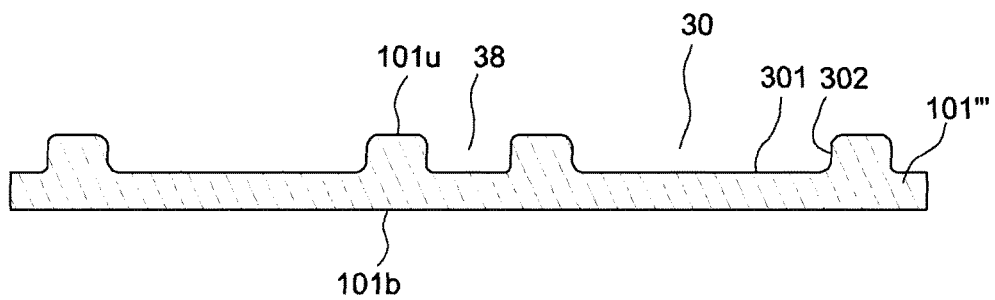
FIG. 12A illustrates a cross-sectional view of a conductive base in accordance with an embodiment of FIG. 6A.

FIG. 12A illustrates a cross-sectional view of a conductive base 101''' in accordance with an embodiment, where the conductive base 101''' replaces the conductive base 101 in FIG. 6A. The conductive base 101''' of FIG. 12A is similar to the conductive base 101 of FIG. 6A, except that vias 38 are defined from the surface 101*u* of the conductive base 101''', and the vias 36 are omitted.

Figure 12B:
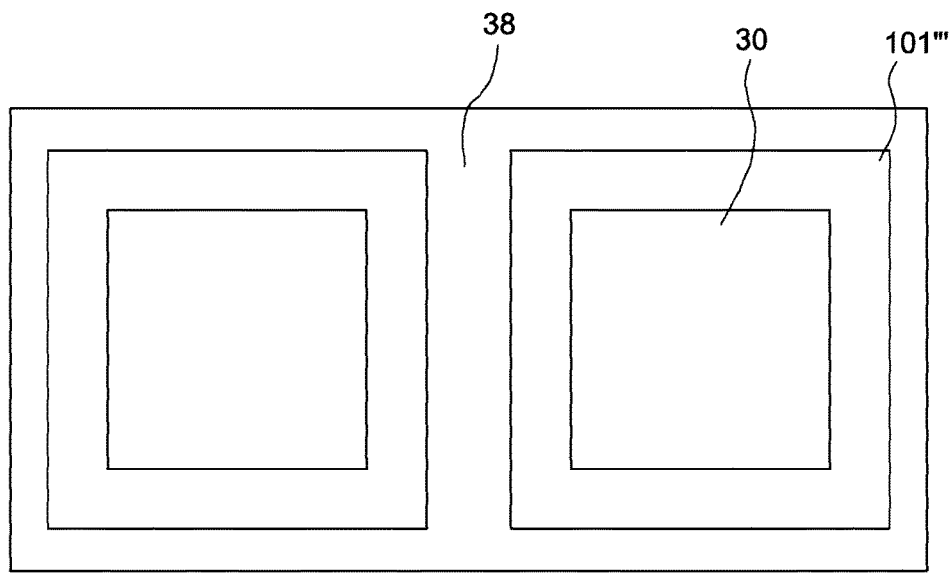
FIG. 12B illustrates a top view of the conductive base in accordance with an embodiment of FIG. 12A.

FIG. 12B illustrates a top view of the conductive base 101''' of FIG. 12A in accordance with an embodiment.

Figure 13A:
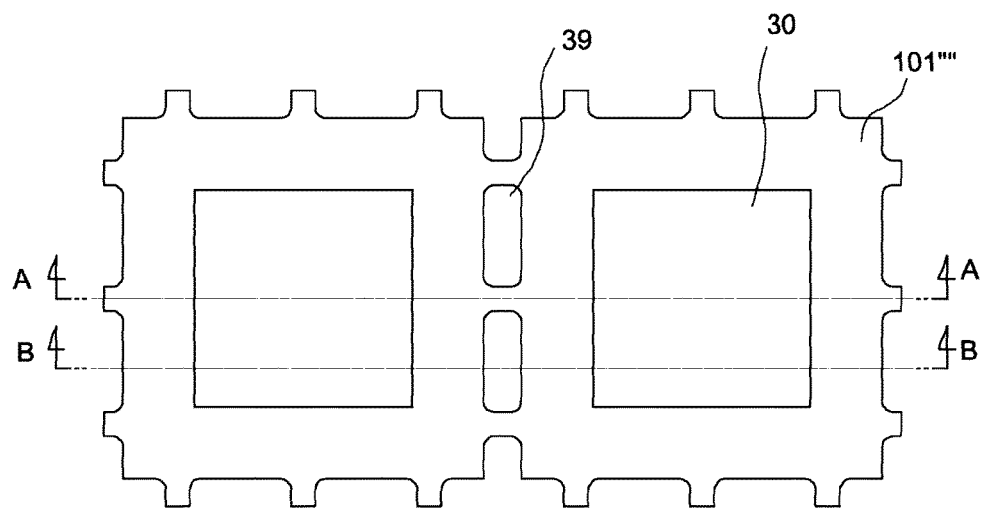
FIG. 13A illustrates a top view of a conductive base in accordance with an embodiment of FIG. 6B.

FIG. 13A illustrates a top view of a conductive base 101'''' in accordance with an embodiment, where the conductive base 101'''' replaces the conductive base 101 in FIG. 6B. In this embodiment, the conductive base 101'''' is similar to the conductive base 101 in FIG. 6A except that the conductive base 101'''' includes through-holes 39.

Figure 13B:
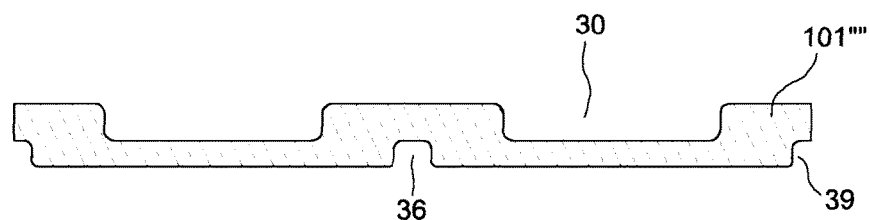
FIG. 13B illustrates a cross-sectional view of a conductive base taken along line A-A of FIG. 13A in accordance with an embodiment.

FIG. 13B illustrates a cross-sectional view of the conductive base 101'''' taken along line A-A of FIG. 13A according to an embodiment. As can be seen, the cross-sectional view of the conductive base 101'''' in FIG. 13A is substantially similar to the cross-sectional view of the conductive base 101 in FIG. 6A.

Figure 13C:
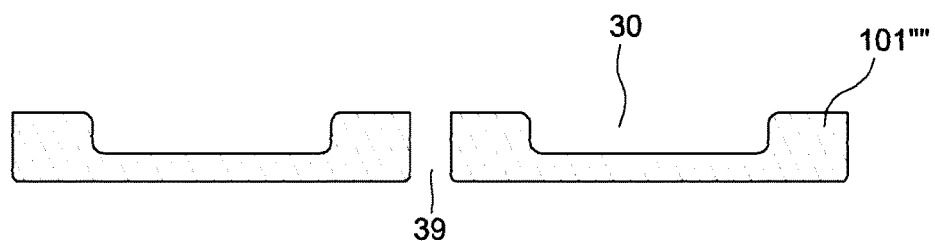
FIG. 13C illustrate a cross-sectional view of a conductive base taken along line B-B of FIG. 13A in accordance with an embodiment.

FIG. 13C illustrates a cross-sectional view of the conductive base 101'''' taken along line B-B of FIG. 13A according to an embodiment. In this embodiment, portions of the conductive base 101'''' are separated by through-holes 39. At least one corner of a through-hole 39 is smoothed.

Figure 13D:
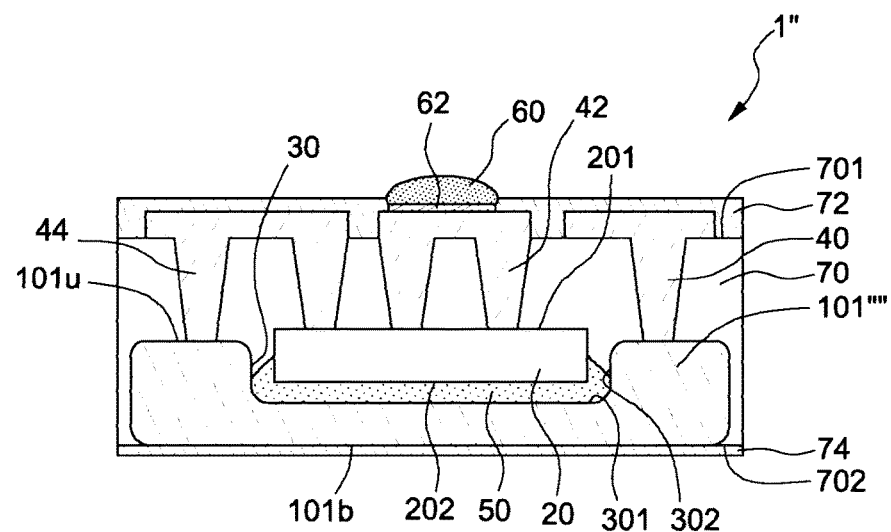
FIG. 13D is a cross-sectional view of a semiconductor device package in accordance with an embodiment of the present disclosure.

FIG. 13D is a cross-sectional view of a semiconductor device package 1'' taken along line B-B of FIG. 13A after separation in accordance with an embodiment. The semiconductor device package 1'' includes the conductive base 101'''', a semiconductor die 20, a conductive adhesive layer 50, a protection layer 70, insulating layers 72 and 74, interconnection structures 40, 42 and 44, a conductive pad 62 and a conductive connect 60.

The semiconductor device package 1'' illustrated in FIG. 13D and taken along line B-B of FIG. 13A is substantially similar to the semiconductor device package 1 of FIG. 1A. In FIG. 13D, however, the protrusions 80 are omitted. In this embodiment, a material of the protection layer 70 also fills the through-hole 39 during lamination of the protection layer 70. Therefore, after lamination of the protection layer 70, a portion of the protection layers 70 will contact the insulating layers 72 and 74.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a variation of less than or equal to ±10% of the numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. Thus, the term "approximately equal" in reference to two values can refer to a ratio of the two values being within a range between and inclusive of 0.9 and 1.1.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

Two surfaces or sides can be deemed to be aligned if a displacement between the two surfaces is no greater than 0.5 µm, no greater than 1 µm, no greater than 5 µm, no greater than 10 µm, or no greater than 15 µm.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising:
   a conductive base, a cavity defined from a first surface of the conductive base, the cavity having a bottom surface and a depth; and
   a semiconductor die disposed on the bottom surface of the cavity, the semiconductor die having a first surface and a second surface opposite the first surface, the second surface of the semiconductor die bonded to the bottom surface of the cavity;
   wherein a distance between the first surface of the semiconductor die and the first surface of the conductive base is about 20% of the depth of the cavity,
   wherein a portion of the conductive base defining a sidewall of the cavity further defines an opening.

2. The semiconductor device package of claim 1, further comprising:
   a protection layer disposed on the conductive base and the semiconductor die; and
   a via filled with a conductive material and extending through the protection layer.

3. The semiconductor device package of claim 1, wherein at least one corner of the conductive base is smoothed.

4. The semiconductor device package of claim 1, wherein the conductive base comprises one or more protrusions.

5. The semiconductor device package of claim 4, wherein the one or more protrusions are smoothed.

6. The semiconductor device package of claim 1, wherein the conductive base comprises a stepped structure.

7. The semiconductor device package of claim 6, wherein the stepped structure is filled with a first insulating material, further comprising a solder mask layer disposed over the first insulating material.

8. The semiconductor device package of claim 1, further comprising a conductive adhesive layer between the second surface of the semiconductor die and the bottom surface of the cavity, wherein the conductive adhesive layer contacts the portion of the conductive base defining the sidewall of the cavity.

9. A semiconductor device package, comprising:
   a conductive base comprising:
      a first surface and a second surface opposite the first surface; and a cavity defined from the first surface of the conductive base, the cavity having a bottom surface and a depth;

a semiconductor die disposed on the bottom surface of the cavity and having a first thickness; and a conductive adhesive layer between the semiconductor die and the bottom surface of the cavity, the conductive adhesive layer having a second thickness;

wherein a sum of the first thickness and the second thickness is different from the depth of the cavity, wherein a portion of the conductive base defining a sidewall of the cavity further defines an opening.

10. The semiconductor device package of claim 9, wherein the conductive base comprises one or more protrusions.

11. The semiconductor device package of claim 9, wherein at least a corner of the conductive base is smoothed.

12. The semiconductor device package of claim 9, wherein the conductive base comprises a stepped structure.

13. The semiconductor device package of claim 9, wherein the conductive adhesive layer contacts the portion of the conductive base defining the sidewall of the cavity.

14. The semiconductor device package of claim 9, wherein the sum of the first thickness and the second thickness is greater than the depth of the cavity.

15. The semiconductor device package of claim 9, wherein the conductive adhesive layer contacts the sidewall of the cavity.

16. A semiconductor device package, comprising:

a conductive base comprising:
  a first surface and a second surface opposite the first surface; and
  a cavity defined from the first surface of the conductive base and having a bottom surface, the conductive base defining a sidewall of the cavity;

a semiconductor die disposed on the bottom surface of the cavity, the semiconductor die having a first surface and a second surface opposite the first surface, the second surface of the semiconductor die bonded to the bottom surface of the cavity; and a protection layer disposed on the conductive base and the semiconductor die, the protection layer having a first surface;

wherein a first distance from the first surface of the semiconductor die to the first surface of the protection layer is different from a second distance from the first surface of the conductive base to the first surface of the protection layer, wherein a portion of the conductive base defining the sidewall of the cavity further defines an opening.

17. The semiconductor device package of claim 16, further comprising a conductive adhesive layer between the semiconductor die and the bottom surface of the cavity.

* * * * *